United States Patent
Swanson et al.

(10) Patent No.: US 9,780,747 B2
(45) Date of Patent: Oct. 3, 2017

(54) FEATURE-BASED LEVEL CONTROL USING LOUDNESS GROWTH FUNCTIONS

(71) Applicant: Cochlear Limited, Macquarie University (AU)

(72) Inventors: Brett Anthony Swanson, Meadowbank (AU); Phyu Phyu Khing, North Sydney (AU)

(73) Assignee: Cochlear Limited, Macquarie University, NSW (AU)

( * ) Notice: Subject to any disclaimer, the term of this patent is extended or adjusted under 35 U.S.C. 154(b) by 0 days.

(21) Appl. No.: 15/078,110

(22) Filed: Mar. 23, 2016

(65) Prior Publication Data
US 2016/0205481 A1 Jul. 14, 2016

Related U.S. Application Data

(62) Division of application No. 13/743,487, filed on Jan. 17, 2013, now Pat. No. 9,331,649.

(60) Provisional application No. 61/591,410, filed on Jan. 27, 2012.

(51) Int. Cl.
| H03G 3/20 | (2006.01) |
| H03G 1/00 | (2006.01) |
| H03G 5/16 | (2006.01) |
| H04R 25/00 | (2006.01) |

(52) U.S. Cl.
CPC ............. *H03G 1/00* (2013.01); *H03G 5/165* (2013.01); *H04R 25/356* (2013.01); *H04R 25/505* (2013.01); *H04R 25/70* (2013.01); *H04R 2430/03* (2013.01)

(58) Field of Classification Search
None
See application file for complete search history.

(56) References Cited

U.S. PATENT DOCUMENTS

| 2002/0057808 A1* | 5/2002 | Goldstein | H04R 25/356 381/106 |
| 2003/0171786 A1* | 9/2003 | Blamey | A61N 1/36032 607/57 |
| 2007/0042736 A1 | 2/2007 | Tateno et al. | |

(Continued)

FOREIGN PATENT DOCUMENTS

| JP | 06337696 A | * 12/1994 |
| JP | 2009-118397 | 5/2009 |
| WO | 00/15001 | 3/2000 |

OTHER PUBLICATIONS

International Search Report and Written Opinion for International Application No. PCT/IB2013/050670, mailed Jun. 26 2013, 11 pages.

*Primary Examiner* — Tan X Dinh
(74) *Attorney, Agent, or Firm* — Edell, Shapiro & Finnan, LLC

(57) ABSTRACT

A computer-implemented method comprising: determining one or more features of a subject signal; revising one or more control signals on the basis of the one or more features; modifying a level of the subject signals based on the control signals. At least one of the features is determined by: comparing a given one of the subject signals against a boundary signal to produce a corresponding given boundary comparison signal; and summarizing the behavior of the given boundary comparison signal over a time interval.

20 Claims, 19 Drawing Sheets

(56) References Cited

U.S. PATENT DOCUMENTS

| | | | |
|---|---|---|---|
| 2008/0069385 A1* | 3/2008 | Revit | H03G 5/025 |
| | | | 381/321 |
| 2008/0123886 A1 | 5/2008 | Andersen et al. | |
| 2009/0208033 A1 | 8/2009 | Kindred et al. | |
| 2011/0013791 A1* | 1/2011 | Griffin | H04R 25/356 |
| | | | 381/317 |
| 2011/0106209 A1* | 5/2011 | Saoji | A61N 1/37247 |
| | | | 607/57 |
| 2011/0135129 A1* | 6/2011 | Neal | H03G 9/005 |
| | | | 381/320 |
| 2013/0103396 A1* | 4/2013 | Swanson | H03G 7/002 |
| | | | 704/225 |
| 2013/0195278 A1* | 8/2013 | Swanson | H03G 1/00 |
| | | | 381/57 |
| 2016/0287870 A1* | 10/2016 | Yip | A61N 1/378 |
| 2016/0336015 A1* | 11/2016 | Pandey | G10L 19/022 |

* cited by examiner

```
% Decision logic 710:

if feature_decision_1
    direction = -1;
else
    direction = 1;
end
```

```
% Decision logic 720:

if feature_decision_1
    direction = -1;
elseif feature_decision_2
    direction = 1;
else
    direction = 0;
end
```

```
% Decision logic 730:

if feature_decision_1
    direction = -1;
elseif feature_decision_2
    direction = -1;
elseif feature_decision_3
    direction = 1;
else
    direction = 0;
end
```

FEATURE-BASED LEVEL CONTROL USING LOUDNESS GROWTH FUNCTIONS

CROSS-REFERENCE TO RELATED APPLICATIONS

This application is a divisional of U.S. patent application Ser. No. 13/743,487, filed Jan. 17, 2013, which claims the benefit of U.S. Provisional Patent Application No. 61/591,410, filed Jan. 27, 2012. The entire disclosure and contents of the above applications are hereby incorporated by reference herein.

FIELD OF THE INVENTION

The present invention relates generally to devices having Automatic Gain Control (AGC) systems, e.g., hearing prostheses, and, more particularly, to processing an input sound signal in order to adjust signal levels.

RELATED ART

Automatic Gain Control (AGC) systems are commonly used in devices, e.g., audio processing devices, to cope with a large range in sound levels. AGC systems are applicable to hearing prostheses, audio headsets, telecommunications systems, and the like. AGC systems are particularly beneficial in hearing prostheses because hearing prostheses generally have a restricted dynamic range. In some systems, the audio signal is split into multiple frequency bands by a filter bank or a transform (e.g., a Fast Fourier Transform). The gain of each band can then be controlled separately. This is referred to as a multi-band type of AGC.

SUMMARY

In one aspect of the present invention, there is provided a computer-implemented method comprising: determining one or more features of a subject signal; revising one or more control signals on the basis of the one or more features; modifying a level of the subject signal based on the control signals. At least one of the features is determined by: comparing the subject signal against a boundary signal to produce a boundary comparison signal; and summarizing the behavior of the boundary comparison signal over a time interval.

In another aspect, there is provided a device comprising: one or more feature extractors, each being configured to extract a respective feature from a subject signal; a controller configured to refine one or more control signals based on the one or more features; and a compressor configured to adaptively perform signal compression on a subject signal according to the one or more control signals to produce a compressed signal.

In yet another aspect, there is provided a method, comprising: determining one or more features of a subject signal; and revising a scaling value for the subject signal on the basis of a comparison between the one or more features and one or more decision thresholds. At least one of the features is determined by: comparing the scaled analysis signal to a predetermined boundary value, to produce a boundary comparison signal; and summarizing the behavior of the boundary comparison signal over a time interval.

In yet another aspect, there is provided a device comprising: a set of feature-based regulators configured to produce a set of control signals from a set of subject signals, respectively; and compressors configured to perform signal compression by adaptively applying loudness growth functions (LGFs) to the set of subject signals according to the set of control signals, respectively. Such a set of control signals includes: a compressor-common control signal applicable to all of the compressors; and a set of compressor-specific control signals, respectively.

BRIEF DESCRIPTION OF THE DRAWINGS

Illustrative embodiments of the present invention are described herein with reference to the accompanying drawings, in which.

DETAILED DESCRIPTION

Embodiments of the present invention may be implemented in sound-processing technologies that benefit from gain control systems, e.g., hearing prostheses, telecommunications systems, and the like. Such systems typically perform a frequency analysis (e.g., via a filter bank or a Fast Fourier Transform unit) that splits an audio signal into analysis signals distributed across multiple frequency bands and then separately adjust the gain of each band.

Figure 1A:
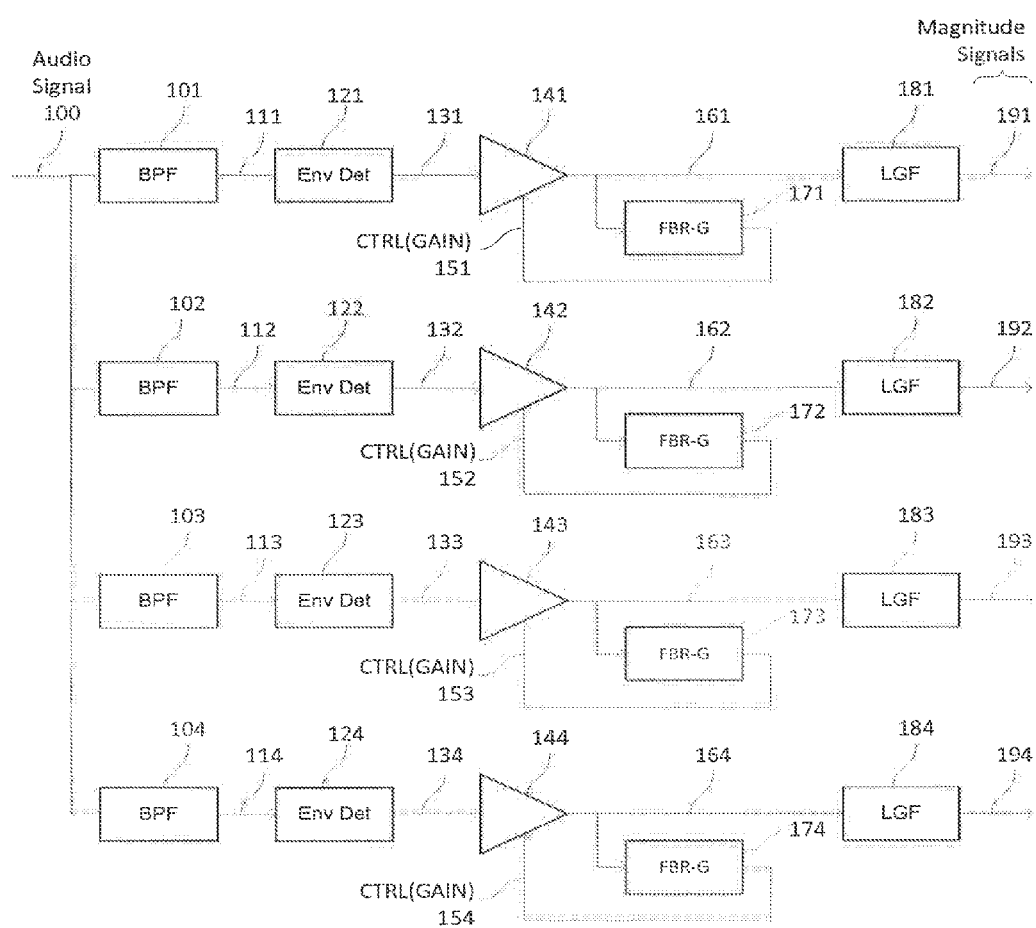
FIG. 1A illustrates a multi-band AGC system for use in a cochlear implant, according to an embodiment of the present invention.

The processing of an audio signal for a device having an AGC system, e.g., a hearing prosthesis such as a cochlear implant, according to an embodiment of the present invention is shown in FIG. 1A. This example shows a four-band AGC system for simplicity of illustration, but a higher number of bands (for example 22) is more typical. An audio signal 100 (e.g., derived from a source such as a microphone, telecoil, etc., typically with a pre-amplifier or front-end AGC, not shown in FIG. 1A) is split into four frequency bands by four band-pass filters 101 through 104 (which can comprise a frequency analysis unit, e.g., a Fast Fourier Transform unit, not shown). Each band-pass filter (BPF) passes a different band of frequencies. Band-pass filters 101 through 104 produce band signals 111 through 114 that are applied to envelope detectors 121 through 124 to produce envelopes 131 through 134. Some implementations use a quadrature pair of band-pass filters in each band, followed by quadrature envelope detection to produce envelopes 131 through 134. Envelopes 131 through 134 are applied to variable-gain amplifiers 141 through 144 to produce scaled envelopes 161 through 164. This operation is equivalent to multiplying envelopes 131 through 134 by band gains 151 through 154. Scaled envelopes 161 through 164 are applied to instances 171 through 174 of a type of feature-based regulator (FBR) that determines gain (namely, an FBR-G) (discussed in more detail below) to determine gains 151 through 154. Scaled envelopes 161 through 164 are applied to instantaneous non-linear compression blocks 181 through 184, also known as loudness growth functions (LGFs), to produce magnitude signals 191 through 194. Magnitude signals are further processed (not shown in FIG. 1A) to determine the stimulation on a corresponding electrode, for example as described in Loizou (1998), Mimicking the human ear, IEEE Signal Processing Magazine, 15: 101-130.

When fitting a cochlear implant system to a recipient, the appropriate stimulation levels for each electrode must be determined. Typically, electrical stimulation is delivered in the form of biphasic pulses. The loudness of a pulse train on an electrode depends on the phase width (typically 10 to 50 microseconds), the gap between phases (typically 0 to 20 microseconds), the current (typically 10 to 1000 microamperes), and the pulse rate (typically 250 to 4000 pulses per second). Typically, the timing parameters (phase width, phase gap and pulse rate) are held constant, and the loudness is varied by varying the current. The lowest current that is delivered on an electrode is here denoted as the lower current level. The highest current that is delivered on an electrode is here denoted as the upper current level. The lower and upper current levels vary between recipients, and also vary between electrodes in a single recipient.

Figure 12A:
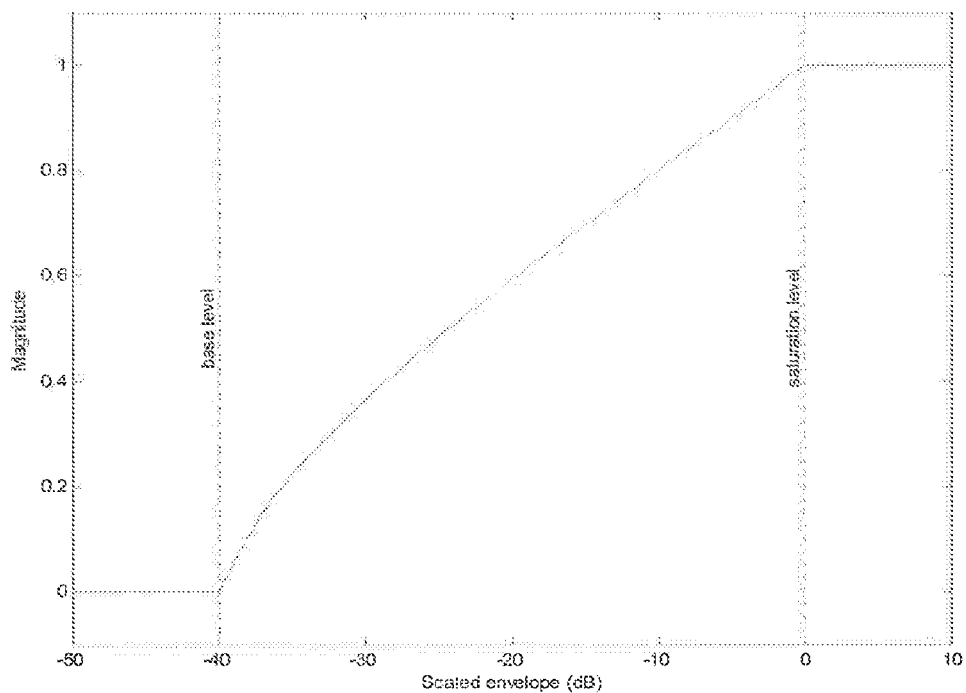
FIG. 12A illustrates an input-output function of a Loudness Growth Function (LGF) and FIG. 12B is a block diagram of an LGF according to an embodiment of the present invention.

An example LGF input-output function is shown in FIG. 12A. As seen in FIG. 12A, scaled envelope amplitudes equal to a specified saturation level are mapped to magnitude value of 1.0, which will result in stimulation at the upper current level. The saturation level is often taken as a reference point, e.g., labeled as 0 dB in FIG. 12A. Scaled envelope amplitudes equal to a specified base level are mapped to magnitude value 0.0, which will result in stimulation at the lower current level. The dynamic range is defined as the ratio of the saturation level to the base level. Typical dynamic range values are from 30 to 50 dB; FIG. 12A shows a dynamic range of 40 dB. The LGF prevents excessive loudness by limiting the current on each electrode to the corresponding upper current level. However, scaled envelope amplitudes greater than the saturation level are clipped to magnitude value 1.0, and hence the upper current level. This clipping is a form of distortion, and one goal of the present invention is to reduce this clipping.

Figure 12B:
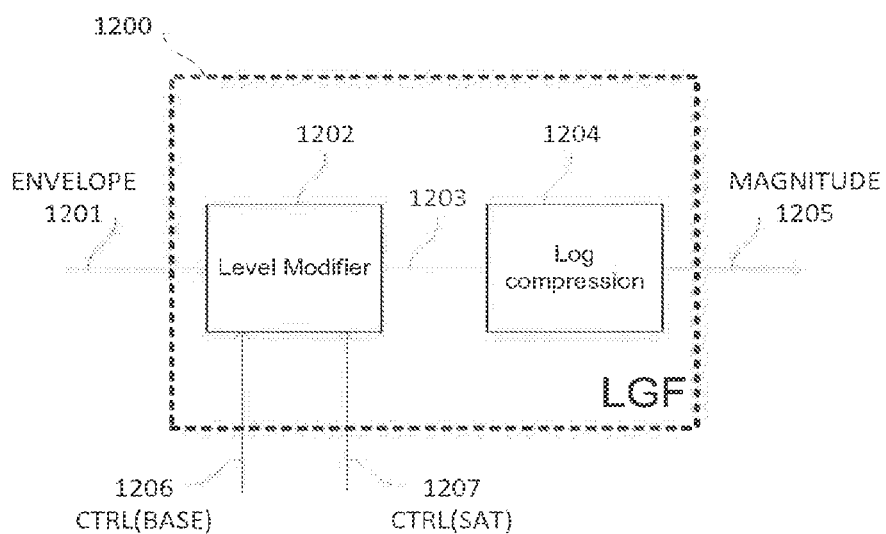

FIG. 12B shows an LGF module 1200 according to an embodiment of the present invention. Envelope 1201 is applied to level modifier 1202 to produce signal 1203. The operation of level modifier 1202 can be expressed in the MATLAB® brand of high-level programming language made available by MathWorks®, Inc., e.g., as follows:

```
if v >= sat_level
    r = 1;
elseif v <= base_level
    r = 0;
else
    r = (v − base_level) / (sat_level − base_level);
end
``` where v is the envelope sample, base_level is the LGF base level 1206, sat_level is the LGF saturation level 1207, and r is signal 1203. In some embodiments of the present invention (e.g., FIG. 1A), base level 1206 and saturation level 1207 are predetermined values. In other embodiments (e.g., FIG. 1B), base level 1206 and saturation level 1207 are control signals that are generated by feature-based regulators (discussed in more detail below).

In some embodiments of level modifier 1202, the division operation is avoided by taking logarithms. In this case, the operation of level modifier 1202 can be expressed in the MATLAB® language, e.g., as follows:

$$\log(r) = \log(v - base\_level) - \log(sat\_level - base\_level);$$

Signal 1203 is applied to logarithmic compression module 1204 to produce magnitude signal 1205. The operation of module 1204 can be expressed in the MATLAB® language, e.g., as follows:

$$m = \log(1 + alpha * r) / \log(1 + alpha);$$

where alpha is a coefficient determining the amount of compression, and m is magnitude 1205. In some embodiments, module 1204 is implemented as a look-up table. In other embodiments, module 1204 is implemented as a piece-wise linear function using interpolation. In an embodiment in which level modifier 1202 takes logarithms, then module 1204 can compensate by incorporating an exponential operation.

Figure 1B:
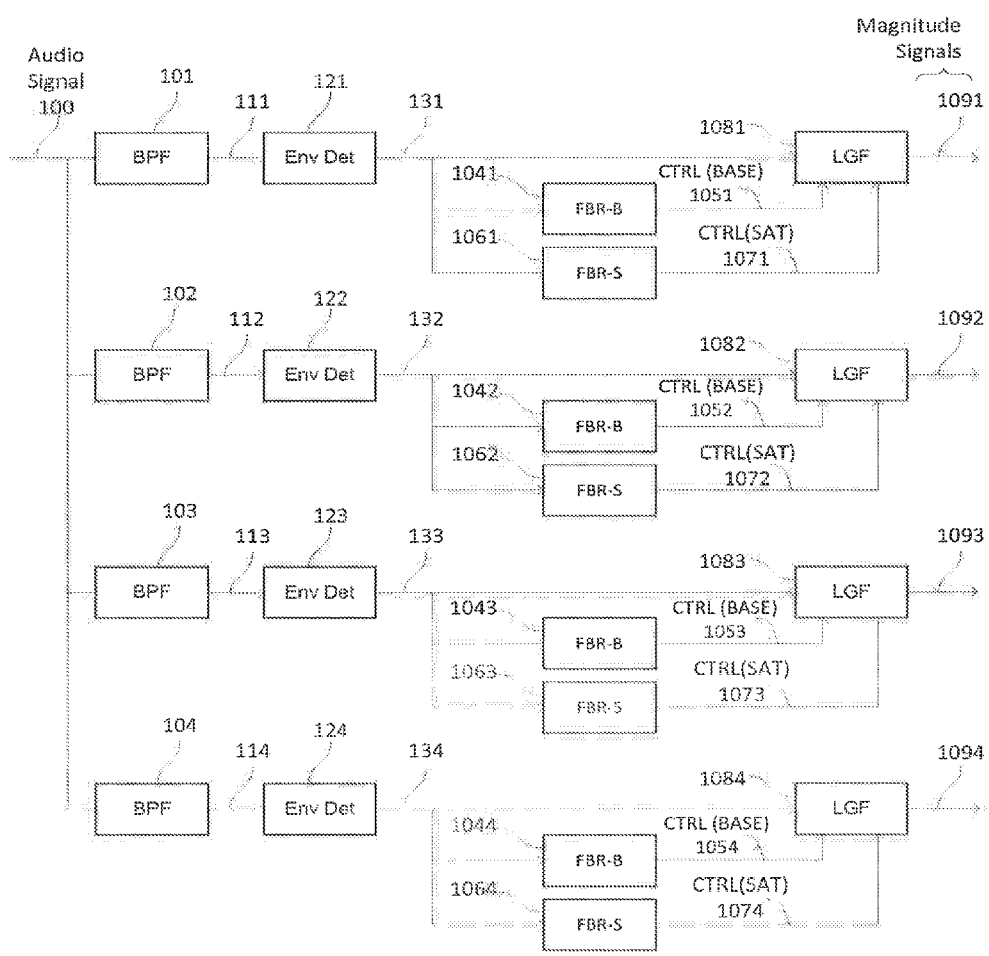
FIGS. 1B and 1C illustrate adaptive LGF systems for use in a cochlear implant, according to embodiments of the present invention.

The processing of an audio signal for a cochlear implant according to another embodiment of the present invention is shown in FIG. 1B. This example shows a four-band system for simplicity of illustration, but a higher number of bands (for example 22) is more typical. Audio signal 100 is processed to produce envelopes 131 through 134 in the same manner as in FIG. 1A. Envelopes 131 through 134 are applied to variable LGF blocks 1081 through 1084, to produce magnitude signals 1091 through 1094. Envelopes 131 through 134 are also applied to instances of a type of feature-based regulator (FBR) that determines base level (namely, an FBR-B) 1041 through 1044 (discussed in more detail below), producing base level signals 1051 through 1054. Envelopes 131 through 134 are also applied to instances of a type of feature-based regulator that determines saturation level (namely, an FBR-S) 1061 through 1064 (discussed in more detail below), producing saturation level signals 1071 through 1074. In contrast to the LGF blocks 181 through 184 in FIG. 1A, which have a fixed base level and saturation level, the variable LGF blocks 1081 through 1084 in FIG. 1B have base levels and saturation levels which are determined by the control signals 1051 through 1054 and 1071 through 1074 respectively.

Figure 1C:
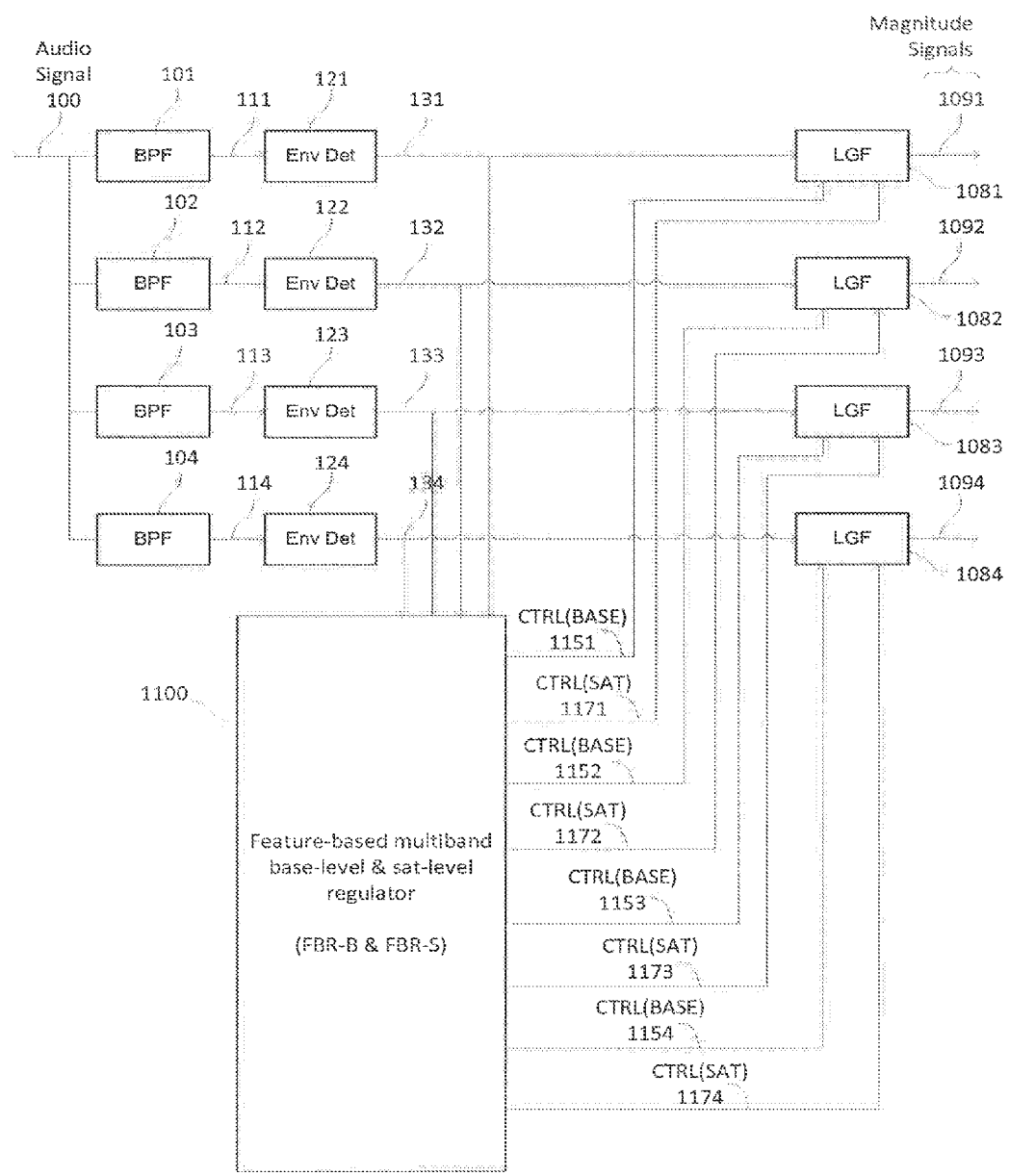

The processing of an audio signal for a cochlear implant according to another embodiment of the present invention is shown in FIG. 1C. This example shows a four-band system for simplicity of illustration, but a higher number of bands (for example 22) is more typical. Audio signal 100 is processed to produce envelopes 131 through 134 in the same manner as in FIG. 1B. Envelopes 131 through 134 are applied to variable LGF blocks 1081 through 1084, to produce magnitude signals 1091 through 1094. Envelopes 131 through 134 are also applied to feature-based multi-band base level and saturation level regulator 1100 (discussed in more detail below), producing base level signals 1151 through 1154 and saturation level signals 1171 through 1174. The difference between the regulator 1100 in FIG. 1C and the regulators 1041 through 1044 and 1061 through 1064 in FIG. 1B is that regulator 1100 allows dependency or co-ordination between the bands.

Figure 2:
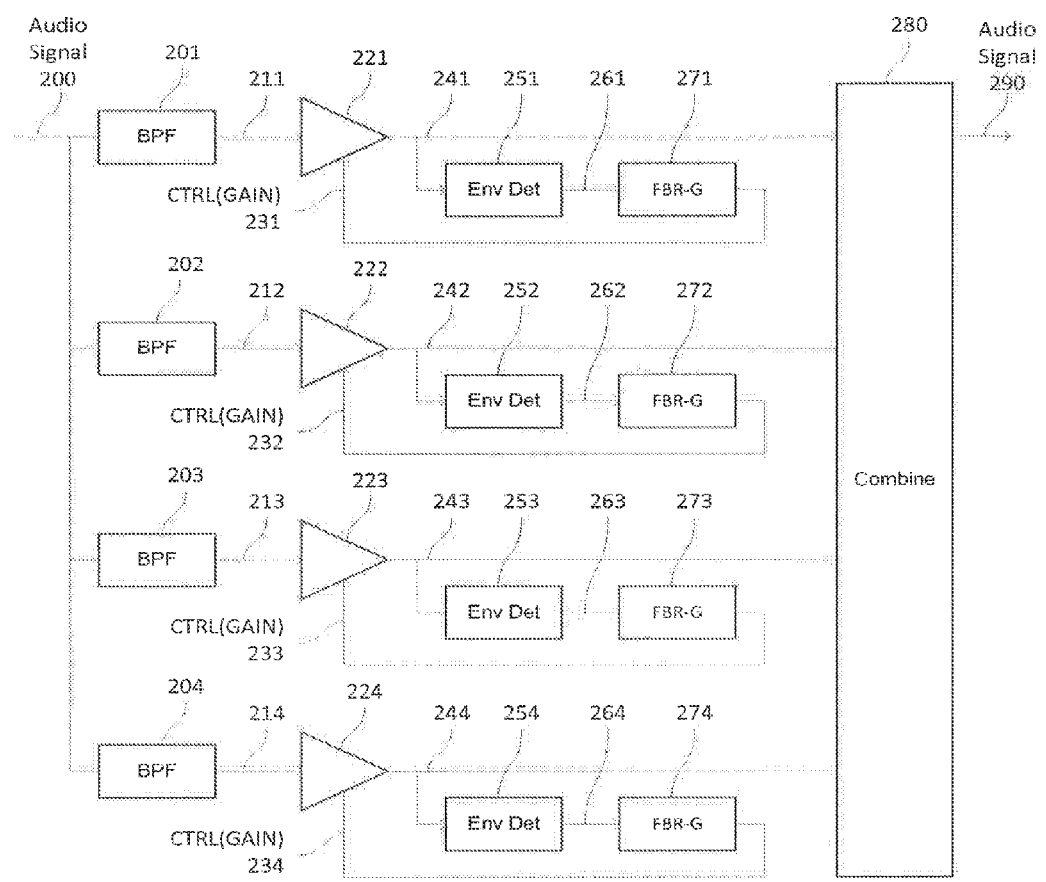
FIG. 2 illustrates a multi-band AGC system for use in an application that provides an audio output, according to another embodiment of the present invention.

The processing of an audio signal for an application that provides an audio signal output, according to an embodiment of the present invention is shown in FIG. 2. Such applications include conventional hearing aids, bone-anchored hearing aids, and telecommunication systems. This example shows a four-band AGC system for simplicity of illustration, but a lower or higher number of bands may be used. An audio signal 200 is split into four frequency bands by four band-pass filters 201 through 204 (which can comprise a frequency analysis unit, e.g., a Fast Fourier Transform unit, not shown). Each band-pass filter (BPF) passes a different band of frequencies. Band-pass filters 201 through 204 produce band signals 211 through 214 that are applied to variable-gain amplifiers 221 through 224 to produce scaled band signals 241 through 244. This operation is equivalent to multiplying band signals 211 through 214 by band gains 231 through 234. Scaled band signals 241 through 244 are applied to envelope detectors 251 through 254 to produce scaled envelopes 261 through 264. Scaled envelopes 261 through 264 are applied to gain-type feature based regulators (FBR-Gs) 271 through 274 (discussed in more detail below) to determine gains 231 through 234. Scaled band signals 241 through 244 are applied to combine module 280 to produce an audio output signal 290. Combine module 280 typically includes a summing operation. Alternatively, if audio signal 200 is divided into bands by an FFT, then combine module 280 incorporates an inverse FFT.

Embodiments of the present invention as shown in FIG. 1A, FIG. 1B, FIG. 1C and FIG. 2 may be implemented as analog signal processing, digital signal processing (DSP), or a mixture of analog and digital. In a DSP implementation, the audio sample rate is defined as the rate at which audio signal 100 or 200 is sampled. Some telecommunications systems use an audio sample rate of 8000 Hz. A typical cochlear implant system uses an audio sample rate of 16000 Hz. To reduce the processing load, envelopes 131 through 134 of FIG. 1A or FIG. 1B or FIG. 1C can be down-sampled to a lower rate. For example, if the cochlear implant stimulates at 1000 pulses per second on each channel, the envelopes can be calculated at 1000 Hz. This rate will be termed the envelope sample rate.

The gain-type feature-based regulators (FBR-Gs) 171 through 174 in FIG. 1A and 271 through 274 in FIG. 2, and the base-level-type feature-based regulators (FBR-Bs) 1041 through 1044 and the saturation-level-type feature-based regulators (FBR-Ss) 1061 through 1064 in FIG. 1B are all examples of feature-based regulators.

Figure 3A:
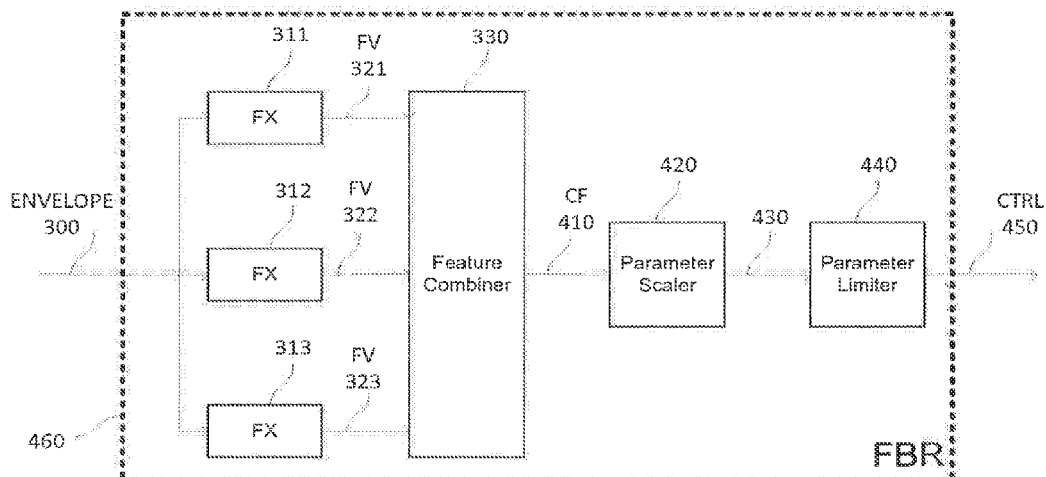
FIGS. 3A, 3B, and 3C illustrate feature-based regulators according to embodiments of the present invention.

A feature-based regulator (FBR) 460 according to an embodiment of the present invention is shown in FIG. 3A. The overall operation is that signal 300 is processed by FBR 460 to produce control signal 450. In more detail, signal 300 is applied to a set of feature extractors (FX) 311 through 313, to produce feature value (FV) signals 321 through 323, which are applied to feature combiner 330. Feature combiner 330 produces combined feature signal 410, which is applied to parameter scaler 420, producing signal 430. Signal 430 is applied to parameter limiter 440 to produce control signal 450.

In both FIG. 1A and FIG. 2, the control signal produced by each FBR is a gain, and the input is a scaled envelope (i.e., an envelope whose amplitude is affected by that gain). In FIG. 1B and FIG. 1C, the inputs to the FBRs are envelopes, and the control signals produced are the base levels and saturation levels of the LGF modules. In each case, the control signal 450 affects the signal level in one band of the overall system, based on the information obtained by the feature extractors.

For the purposes of illustration, FBR 460 shown in FIG. 3A utilizes three features. However, an FBR may utilize any number of features. Suitable methods for the feature combiner 330 to combine the feature value signals include a weighted sum, the maximum value, the minimum value, or the median value.

Figure 3B:
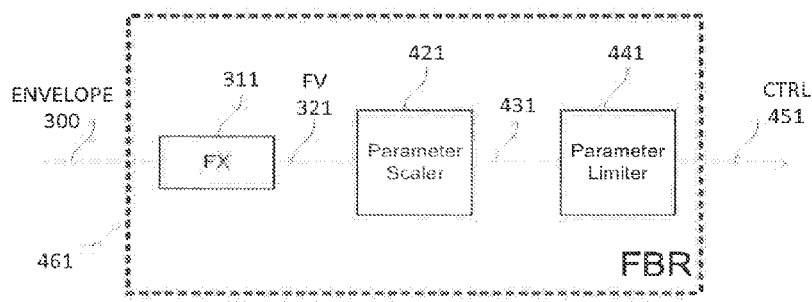

FIG. 3B shows an FBR 461 according to another embodiment of the present invention. FBR 461 utilizes a single feature extractor 311, which produces feature value signal 321. As there is only one feature, no feature combiner is needed, and feature value signal 321 is taken directly to parameter scaler 421.

Figure 3C:
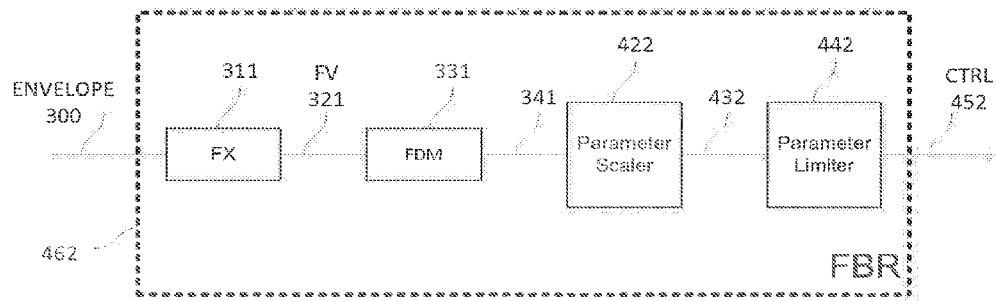

FIG. 3C shows a FBR 462 according to another embodiment of the present invention. FBR 462 is similar to FBR 461, except that feature value signal 321 is applied to feature decision module (FDM) 331 (described in more detail below), to produce feature decision signal 341. Feature decision signal 341 is a Boolean signal (true or false), or equivalently a binary signal, taking the values 1 or 0. The feature decision signal 341 is applied to parameter scaler 422.

Figure 3D:
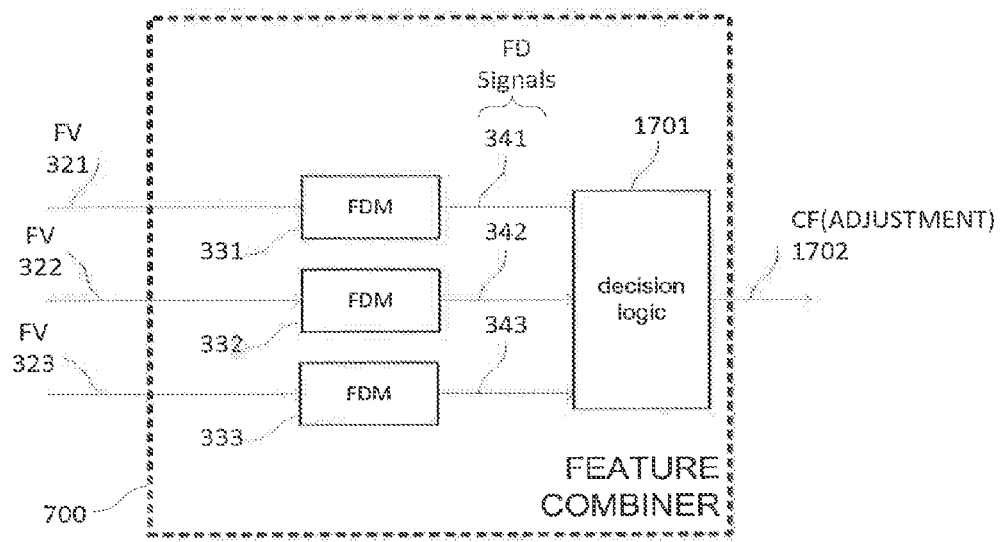
FIG. 3D illustrates a feature combiner according to an embodiment of the present invention.

FIG. 3D shows a feature combiner 700 according to another embodiment of the present invention. Feature value signals 321 through 323 are applied to corresponding feature decision modules 331 through 333. Feature decision signals (Boolean signals) 341 through 343 are applied to decision logic 1701, which produces direction signal 1702. Decision logic 1701 is typically implemented as a sequence of if-then-else logical statements. In one embodiment, direction 1702 is represented by a variable with three possible values: +1 (meaning increase the control signal), −1 (meaning decrease the control signal), or 0 (meaning no change in the control signal).

For example, if FBR 460 of FIG. 3A was implemented as an FBR-G, control signal 450 would be gain, and so parameter scaler 420 would be referred to as a gain scaler, and parameter limiter 440 could be referred to as a gain limiter. Similarly, for example, with reference to FIG. 3D, decision logic 1701 can be referred to as gain logic.

Figure 3E:
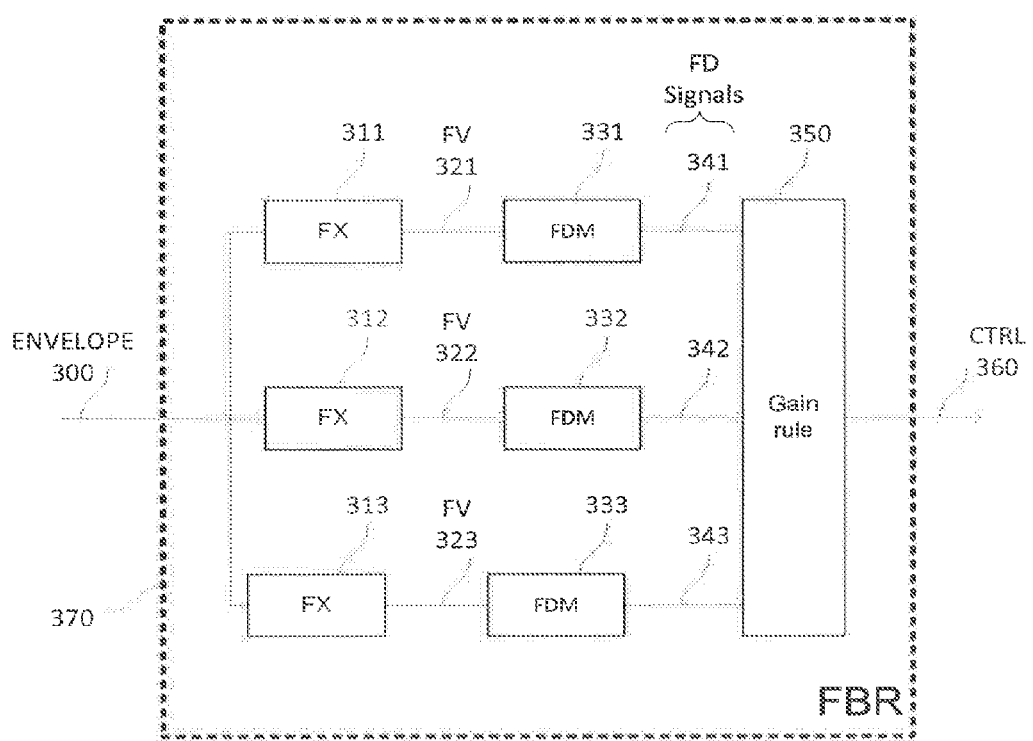
FIG. 3E illustrates a feature-based gain module according to an embodiment of the present invention.

A gain-type feature-based regulator (FBR-G) 370 according to an embodiment of the present invention is shown in FIG. 3E. FBR-G 370 is an example of FBR-G modules 171-174 and 271-274. The overall operation is that scaled envelope 300 is processed by FBR-G 370 to produce gain 360. Note that in both FIG. 1 and FIG. 2, the output of each FBR-G is a gain, and the input is a scaled envelope (i.e., an envelope whose amplitude is affected by that gain). In more detail, scaled envelope 300 is applied to a set of feature extractors (FX) 311 through 313, to produce feature value signals 321 through 323, which are applied to feature decision modules (FDMs) 331 through 343, to produce feature decision signals 341 through 343. Each feature decision signal is a Boolean signal (true or false), or equivalently a binary signal, taking the values 1 or 0. The feature decision signals are applied to gain rule 350 (described in more detail below) which produces gain 360.

A characteristic of a FBR (e.g., 460, 461, 462, or 370) is the update rate, defined as the rate at which the control signal (gain, base level or saturation level, e.g., 450, 451, 452, or 360) is changed. This may be equal to the envelope sample rate (for example 1000 Hz), or may be lower. Typically, the feature extractors (e.g., 311 through 313) produce their feature value signals 321 through 323 at the update rate.

Figure 4:
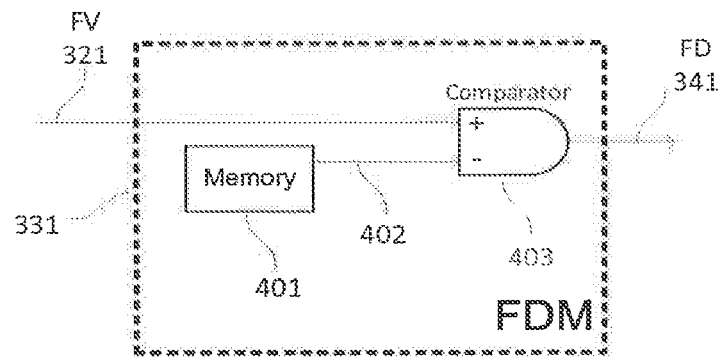
FIG. 4 illustrates a feature decision module according to an embodiment of the present invention.

The FDMs (e.g., 331 through 333 in FIG. 3C, FIG. 3D and FIG. 3E), e.g., all have the same structure. An FDM 331 according to an embodiment of the present invention is shown in FIG. 4A, where FDM 331 is an example of FDMs 331-334. FDM 331 includes comparator 403 that produces feature decision signal 341 indicating whether feature value signal 321 exceeds feature decision threshold 402. Feature decision threshold 402 is, e.g., a predetermined value stored in memory 401.

Figures 10A, 10B, 10C, 10D:
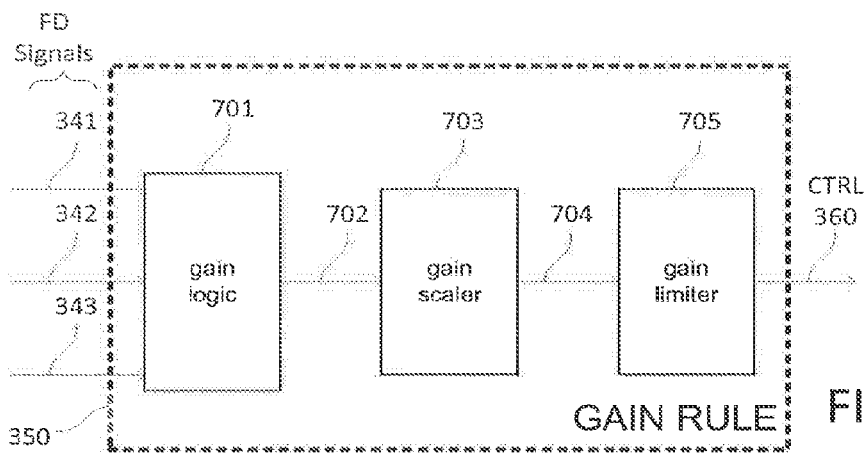
FIG. 10A illustrates a gain rule according to an embodiment of the present invention.
FIGS. 10B, 10C, and 10D illustrate decision logic according to embodiments of the present invention.

FIG. 10A shows a gain rule 350 according to an embodiment of the present invention. Feature decision signals (Boolean signals) 341 through 343 are applied to gain logic 701, which produces gain direction 702. Gain logic 701 is typically implemented as a sequence of if-then-else logical statements. In one embodiment, gain direction 702 is represented by a variable with three possible values: +1 (meaning increase gain), −1 (meaning decrease gain), or 0 (meaning no gain change). For the purposes of illustration, gain rule 350 shown in FIG. 3E and FIG. 10A utilizes three features. However, a gain rule may utilize any number of features.

Gain logic 701 in FIG. 10A is equivalent to decision logic 1701 in FIG. 3D. FIGS. 10B, 10C, and 10D show examples 710, 720 and 730 of gain logic 701 or decision logic 1701 according to additional embodiments of the present invention, with different numbers of features, e.g., expressed in the MATLAB® language. FIG. 10B shows decision logic 710 that utilizes a single feature. FIG. 10C shows decision logic 720 that utilizes two features. FIG. 10D shows decision logic 720 that utilizes three features.

In some embodiments utilizing decision logic (e.g., 1701 in FIG. 3D), the parameter scaler modifies the existing control signal in a proportional manner, according to the value of direction 1702. The operation of parameter scaler can be expressed in the MATLAB® language, e.g., as:

```
if direction < 0
    param = param * down_factor
elseif direction > 0
    param = param * up_factor
end
``` where param is a variable representing the control signal (e.g., one of gain, base level, saturation level, etc.), up_factor is a pre-determined factor for increasing the control signal, and down_factor is a pre-determined factor for decreasing the control signal.

An example calculation of the up_factor and down_factor can be expressed in the MATLAB® language, e.g., as follows:

up_step_dB=up_slew_rate/update_rate;
down_step_dB=down_slew_rate/update_rate;
up_factor=10^(up_step_dB/20);
down_factor=10^(down_step_dB/20);

where update_rate is the rate at which the control signal is updated, up_slew_rate is the increase in dB per second and down_slew_rate is the decrease in dB per second.

Parameter limiter (440, 441, or 442) constrains the control signal to lie between a maximum and a minimum value. The operation of the parameter limiter can be expressed in the MATLAB® language, e.g., as:

```
if param > param_max
    param = param_max
elseif param < param_min
    param = param_min
end
``` where param_min is the minimum value of the control signal and param_max is the maximum value.

As a specific example, in FIG. 10A, gain scaler 703 modifies the existing gain in a proportional manner, according to the value of gain direction 702. The operation of gain scaler 703 can be expressed in the MATLAB® language, e.g., as:

```
if gain_direction < 0
    gain = gain * gain_down_factor
elseif gain_direction > 0
    gain = gain * gain_up_factor
end
``` where gain_up_factor is a pre-determined factor for increasing the gain, and gain_down_factor is a pre-determined factor for decreasing the gain.

An example calculation of the gain_up_factor and gain_down_factor can be expressed in the MATLAB® language, e.g., as follows:

gain_up_step_dB=gain_up_slew_rate/update_rate;
gain_down_step_dB=gain_down_slew_rate/update_rate;
gain_up_factor=10^(gain_up_step_dB/20);
gain_down_factor=10^(gain_down_step_dB/20);

where update_rate is the rate at which the gains are updated, gain_up_slew_rate is the gain increase in dB per second (e.g., 3 dB per second) and gain_down_slew_rate is the gain decrease in dB per second (e.g., −10 dB per second).

Gain limiter 705 constrains the gain to lie between a maximum and a minimum value. The operation of gain limiter 705 can be expressed in the MATLAB® language, e.g., as:

```
if gain > gain_max
    gain = gain_max
elseif gain < gain_min
    gain = gain_min
end
``` where gain_min is the minimum gain and gain_max is the maximum gain.

A variety of features may be usefully employed in an embodiment of a feature-based regulator (FBR), for example, peak level, minimum level, noise floor, percentiles, modulation depth, specific loudness, and signal-to-noise ratio. Some additional feature extractors 500, 600, 620, 640 and 660 are disclosed below in the context of FIGS. 5 through 9, respectively.

Figure 5A:
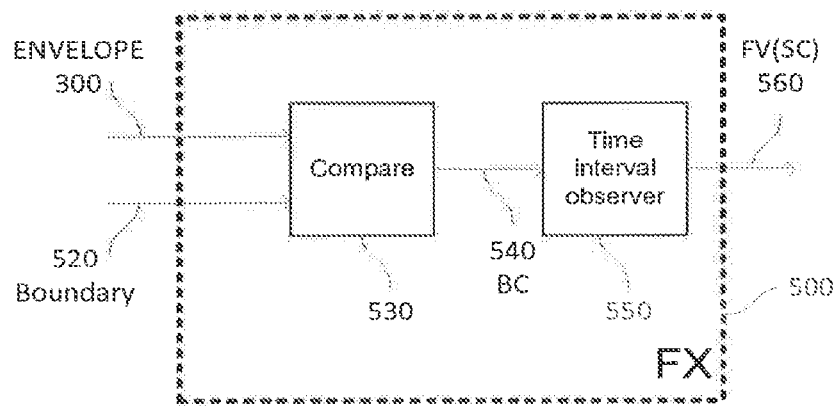
FIGS. 5A, 5B, 6, 7, 8 and 9 illustrate feature extractors according to embodiments of the present invention.
Figure 5B:
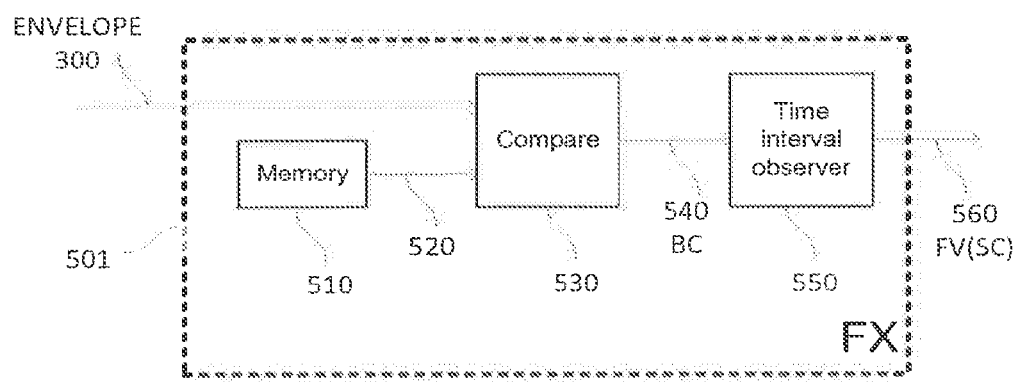

FIG. 5A shows a feature extractor 500 according to an embodiment of the present invention. Comparison module 530 compares envelope 300 to boundary signal 520, and produces boundary comparison (BC) signal 540. Several embodiments of comparison module 530 are described below. BC 540 can contain fluctuations on the same time scale as envelope 300. BC signal 540 is applied to time interval observer 550. Time interval observer 550 summarizes the behavior of BC 540 over the most recent time interval, and produces summarized boundary comparison (SC) type of feature value (FV), namely FV(SC), signal 560, which fluctuates more slowly than envelope signal 300. Examples of suitable time interval durations range from 50 milliseconds to several seconds. Several embodiments of time interval observer 550 are described below. FIG. 5B shows feature extractor 501, according to another embodiment of the present invention, in which boundary signal 520 is a predetermined value stored in memory 510. In other embodiments, boundary signal 520 is a time-varying signal (described in more detail below), rather than a predetermined value.

Figure 6:
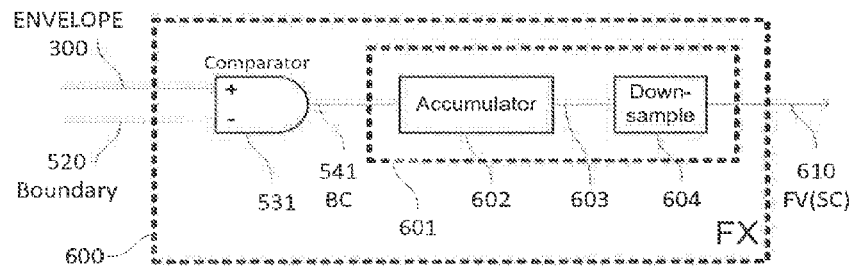

FIG. 6 shows feature extractor 600 according to an embodiment of the present invention, where feature extractor 600 is an example of feature extractor 500. Comparator 531 is an example of comparison module 530 of FIGS. 5A-5B. Comparator 531 produces BC signal 541 indicating whether scaled envelope 300 exceeds boundary value 520. BC signal 541 is a Boolean signal (true or false), or equivalently a binary signal, taking the values 1 or 0. Time interval observer 601 is an example of time interval observer 550 in FIGS. 5A-5B. Accumulator 602 operates according to a series of time intervals, where the segment length is defined as the number of samples of scaled envelope signal 300 in each time interval. Accumulator 602 is cleared at the beginning of each time interval. During each time interval, accumulator 602 sums BC 541 (a binary signal). In other words, it counts the number of samples for which scaled envelope 300 exceeds boundary signal 520. The output of accumulator 602 is count 603, which is an example representation of the proportion of scaled envelope samples that exceeds the boundary signal. At the end of each time interval, the value of count 603 lies in the range zero up to the segment length (i.e., up to the maximum number of samples that can be operated upon during the interval). The segment length determines the minimum number of bits for accumulator 602. For example, if the segment length is 25, then accumulator 602 must have at least 5 bits, while if the segment length is 250, then accumulator 602 must have at least 8 bits. Although accumulator 602 operates at the envelope sample rate, only the final value of count 603 at the end of each time interval is provided as the output of time interval observer 601, namely as FV(SC) 610, which is an example of a summarized boundary comparison (SC) type of feature value (FV) signal. This reduction in processing rate is represented by down-sample block 604. For example if the envelope sample rate is 1000 Hz, and the time intervals are 100 milliseconds in duration, then the segment length is 100, and the update rate is 10 Hz.

The operation of feature extractor 600 can be expressed in the MATLAB® language, e.g., as:

```
count = 0;
for n = 1:segment_length
    if v(n) > boundary(n)
        count = count + 1;
    end
end
``` where v is a segment of the envelope signal 300 containing segment_length samples, n is the sample index within the segment, boundary is a segment of boundary signal 520, and count is the feature value signal 610.

In an alternative embodiment of feature extractor 600, the output of accumulator 602 is normalized (i.e., divided by the number of samples in the time interval) to obtain a feature value signal 610 that represents the proportion of envelope samples that exceed the boundary signal. This step can be expressed in the MATLAB® language, e.g., as:

proportion_exceeds_boundary=count/segment_length;

Such a proportion necessarily lies in the range 0 to 1. This normalization step is not strictly necessary, and is typically omitted from a fixed-point DSP implementation. And yet the normalization step has an advantage of providing a feature signal that has a more readily understood meaning, and it allows the corresponding decision threshold to also be expressed as a proportion, independent of the time interval duration or update rate.

It can be desirable to increase the time duration over which the system observes the envelope levels when making decisions on the appropriate control signal. Feature extractor 600 has the property that increasing the time interval duration leads to a lower update rate and larger control signal steps, which may become objectionable to the listener. This issue can be alleviated by utilizing overlapping time intervals. For example, the time interval duration can be increased to one second (i.e., segment_length=1000 samples), while keeping a 10 Hz update rate, so that each time interval has a 90% overlap with the previous time interval. To increase computational efficiency, for example, each time interval can be divided into 10 non-overlapping sub-segments, each having 100 samples. The number of envelope samples exceeding the boundary signal is counted for each sub-segment, and the resulting counts are stored in a first-in, first-out (FIFO) buffer, of length 10. The final count for the time interval ending at each sub-segment is obtained as the sum of the last 10 sub-segment counts. This operation is equivalent to a running sum operation on the sequence of sub-segment counts, i.e., a finite-duration impulse response (FIR) filter with all coefficients equal to one. An embodiment that operates in this manner is shown in FIG. 7.

Figure 7:
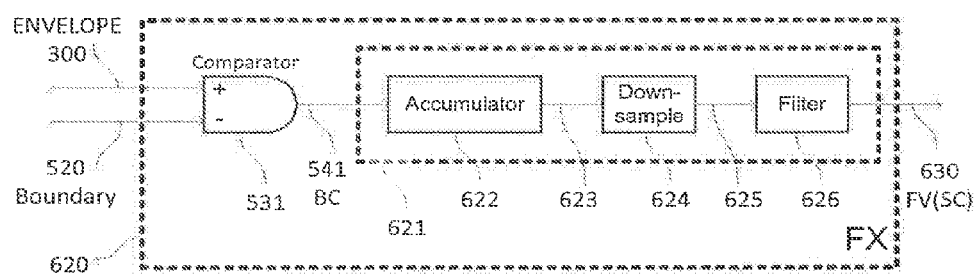

FIG. 7 illustrates feature extractor 620 according to an embodiment of the present invention, where feature extractor 620 is another example of feature extractor 500. Feature extractor 620 is similar to feature extractor 600, the difference being in time interval observer 621, which is another example of time interval observer 550 from FIGS. 5A-5B. Time interval observer 621 comprises accumulator 622 and down-sample block 624, which operate as in feature extractor 600, and further includes a low-pass filter 626 applied to count signal 625. Low-pass filter 626 operates at the update rate, and extends the time interval over which BC 541 is observed. Normalization, as previously described, can optionally be applied to count signal 625 or to filter output FV(SC) 630, which is an example of a summarized boundary comparison (SC) type of feature value (FV) signal.

In one example embodiment, low-pass filter 626 is an FIR filter with all coefficients equal to one, as previously described. Alternatively, the FIR coefficients can be designed to give a specified time response, for example to give less weight to past segments. Alternatively an order-statistics filter can be applied to the sequence of counts, such as for median filtering, or for example taking the maximum count over the last 10 segments.

Alternatively filter 626 can be an infinite-duration impulse response (IIR) filter. This has an advantage that the signals can be observed over much longer time intervals whilst minimizing the memory requirements. For example, a first-order smoothing filter can be expressed in the MATLAB® language, e.g., as:

smoothed_count=(1−alpha)*count+ alpha*smoothed_count;

where smoothed_count is the filtered count signal 630, and alpha is a decay factor in the range 0 to 1. This requires one additional word of storage per band and per target.

As a special case, if alpha is set equal to 0.5, the expression becomes:

smoothed_count=0.5*(count+smoothed_count);

In this special case, no additional storage is required: at the start of each segment, instead of initializing the counts to zero, the previous values of the counts are halved, and then the counts are incremented from these non-zero starting points; thus, one memory location holds the sum of the current count and its history. Effectively the accumulator 622 and the filter 626 have been combined. This arrangement can be further generalized as shown in FIG. 8.

Figure 8:
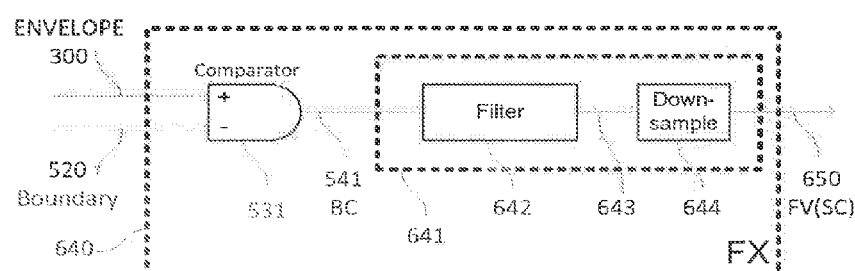

FIG. 8 illustrates feature extractor 640 according to an embodiment of the present invention, where feature extractor 640 is another example of feature extractor 500. Time interval observer 641 is an example of time interval observer 550 in FIGS. 5A-5B, and comprises low-pass filter 642 and down-sample block 644. Filter 642 acts directly on the BC 541. Because BC 541 is a binary signal, filter 642 can be implemented efficiently, e.g., in hardware, with many multiplications replaced by conditional addition. Filter output signal 643 represents the average value of BC 541, in other words, it represents the proportion of time that envelope signal 300 exceeds the boundary signal 520. Filter 642 can be designed to give a specified time response; for example, to give more weight to more recent samples. In one example embodiment, filter output signal 643 is calculated at the envelope sample rate, and is down-sampled by down-sample block 644 to give FV(SC) 650 at the update rate, where FV(SC) is which is an example of a summarized boundary comparison (SC) type of feature value (FV) signal. The skilled artisan would understand how to merge down-sample block 644 into filter 642, e.g., for the purposes of enhancing efficiency. Alternatively, down-sample block 644 can be omitted if it is desired to make the update rate equal to the envelope sample rate.

Figure 9:
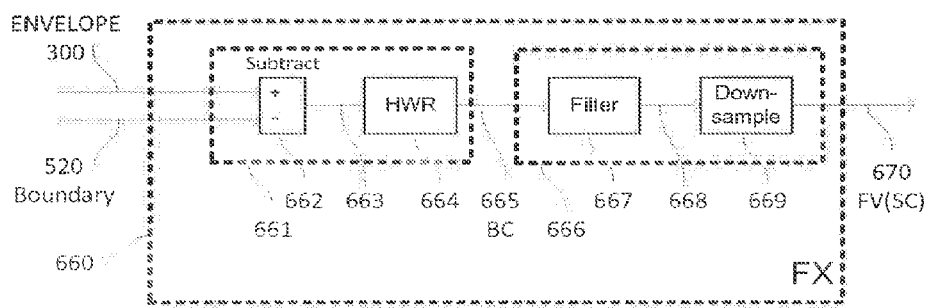

FIG. 9 illustrates feature extractor 660 according to an embodiment of the present invention, where feature extractor 660 is another example of feature extractor 500. Block 661 is an example of comparison module 530 of FIGS. 5A-5B. In contrast to feature extractors 600, 620, and 640, which use comparator 531 to determine whether the envelope signal 300 exceeds boundary signal 520, block 661 calculates the amount by which envelope signal 300 exceeds boundary signal 520. Subtractor 662 subtracts boundary signal 520 from envelope signal 300 to produce difference signal 663, which is rectified by half-wave rectifier (HWR) 664. The operation of block 661 can be expressed in the MATLAB® language, e.g., as:

$d=v-\text{boundary}$;

excess=max($d$,0);

where v is envelope signal 300, boundary is boundary signal 520, d is difference signal 663, and excess is a boundary comparison (BC) signal 665. BC 665 is then applied to time interval observer 666, which is an example of time interval observer 550 in FIGS. 5A-5B, which comprises low-pass filter 667 and down-sample block 669, and which produces a signal FV(SC) 670, which is an example of a summarized boundary comparison (SC) type of feature value (FV) signal. FV(SC) 670 characterizes the average amount by which the envelope 300 exceeds boundary signal 520 over the most recent time interval.

Figure 11:
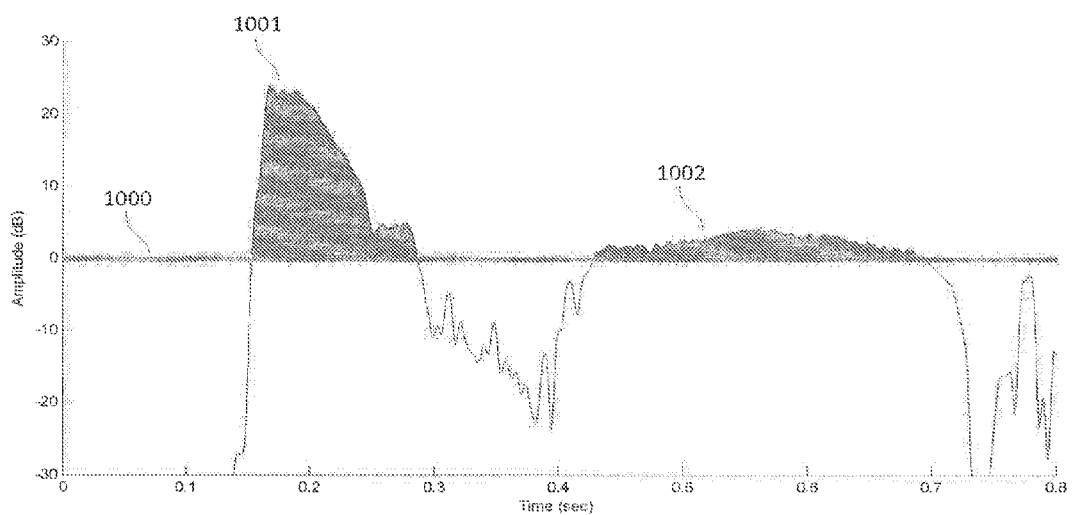
FIG. 11 illustrates a short segment of one band of a speech signal.

FIG. 11 illustrates a short segment of one band of a speech signal and can serve to illustrate differences between feature extractor 660 and feature extractors 600, 620, and 640. This example is a gain-type feature-based regulator (FBR-G), in which the control signal 670 is gain (as in FIG. 1A), and the boundary signal 520 is a predetermined boundary level (as in FIG. 5B). The shaded region indicates the amount by which the scaled envelope signal 300 exceeds the boundary level 520, which is 0 dB in this example. There are two excursions of the scaled envelope signal above the boundary level: the first excursion 1001 starts at a time of about 0.15 seconds and the second excursion 1002 starts at a time of about 0.45 seconds. If feature extractor 600, 620, or 640 is used, then the first excursion 1001 produces a smaller gain decrement than the second excursion 1002, because the first excursion has a shorter duration. However, if feature extractor 660 is used, filter 667 acts as an integrator, estimating the area of the shaded regions, and so the first excursion 1001 produces a greater gain decrement than the second excursion 1002, because the first excursion has a larger area. Thus, feature extractor 660 is more responsive to large-amplitude, short-duration transients.

Some specific examples of gain-type feature-based regulators (FBR-Gs) are described below. Each, e.g., has the same overall structure as FBR-G 370 in FIG. 3E, but with different numbers and types of internal components.

Figure 13:
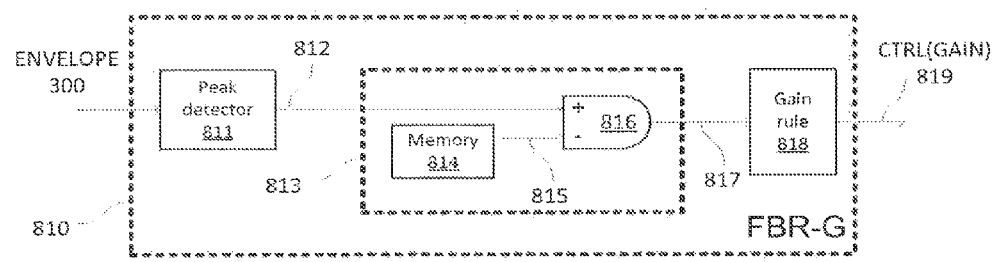
FIGS. 13 through 15 illustrate feature-based gain modules according to embodiments of the present invention.

An FBR-G 810 according to an embodiment of the present invention is shown in FIG. 13. Like FBR-G 370, FBR-G 810 is an example of FBR-Gs 171-174 and 271-274. FBR-G 810 utilizes a single feature extractor, namely peak detector 811. Peak detector 811 produces feature value signal, designated peak level 812. An embodiment of peak detector 811 can be expressed in the MATLAB® language, e.g., as:

$x(n)=\max(v(n),x(n-1)*\text{peak\_decay\_weight})$;

where v(n) is a sample of scaled envelope signal 300, x(n) is a sample of peak level 811, x(n−1) is the previous sample of peak level 811, and peak_decay_weight is determined from the envelope sample rate and a predetermined peak decay time, which can be expressed in the MATLAB® language, e.g., as follows:

$T=1/\text{envelope\_sample\_rate}$;

peak_decay_weight=exp(−$T$/peak_decay_time);

Feature decision module 813 compares peak level 812 to peak threshold 815, and produces feature decision signal 817, denoted peak_too_high. Feature decision signal peak_too_high 817 is applied to gain rule 818, which utilizes, e.g., decision logic 710 from FIG. 10B. The overall operation of FBR-G 810 is that if the peak level is too high, the gain is reduced, otherwise the gain is increased. In a cochlear implant system, an example value for the peak threshold is a point mid-way between the base level and the saturation level, for example 20 dB below the saturation level in FIG.

12A. Example values for other parameters are: peak decay time of 0.5 seconds, gain slew up rate of 6 dB per second, and gain slew down rate of 6 dB per second. Thus, FBR-G 810 acts so that during speech activity, the peak levels spend about half of the time above the peak threshold, thus, aiding audibility. In the absence of speech activity, the gain increases up to the maximum gain, which is set so that background noise is not objectionable.

Figure 14:
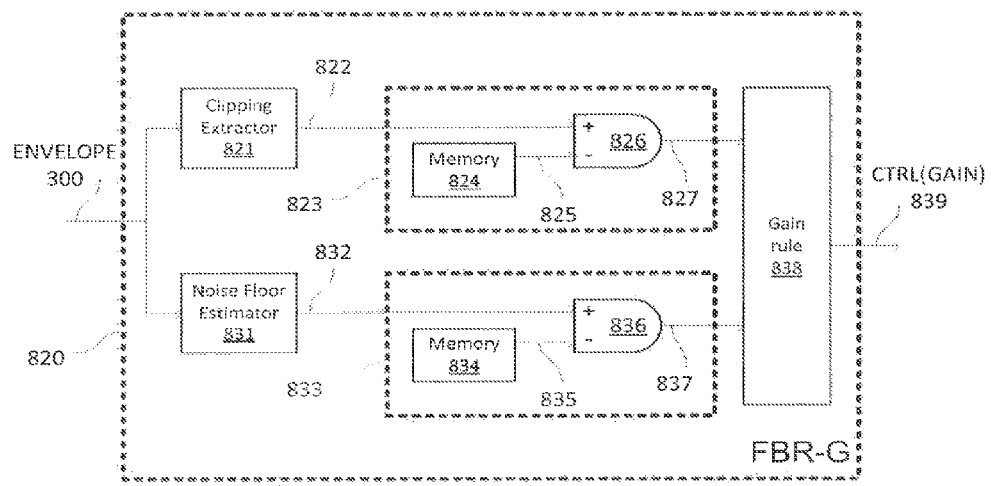

FIG. 14 illustrates an FBR-G 820 according to an embodiment of the present invention. Like FBR-Gs 370 and 810, FBR-G 820 is an example of FBR-G 171-174 and 271-274. FBR-G 820 can be used, e.g., with a cochlear implant, as in FIG. 1A. FBR-G 820 utilizes two feature extractors, 821 and 831. Feature extractor 821, denoted clipping extractor, is an instance of feature extractor 620 from FIG. 7, and incorporates normalization as described previously. It is configured with boundary value 520 equal to the LGF saturation level shown in FIG. 12A. Thus, BC 541 indicates whether scaled envelope 300 exceeds the LGF saturation level; in other words, it indicates whether the scaled envelope is clipped. Thus, feature value signal 822 represents the proportion of scaled envelope samples that were clipped during the last time interval, and is denoted clipping_proportion. Feature decision module 823 compares feature value signal clipping_proportion 822 to decision threshold 825, to produce feature decision signal 827. An example decision threshold is 0.1. In this case, feature decision signal 827 will be high (true) if more than 10% of scaled envelope samples were clipped in the last time interval. Feature decision signal 827 is denoted as clipping_too_often in a logic statement below.

Feature extractor 831 is a noise floor estimator. An example embodiment of feature extractor 831 is described in Martin R (2001), "Noise power spectral density estimation based on optimal smoothing and minimum statistics," IEEE Transactions on Speech and Audio Processing, 9: 504-512. Feature value signal 832 is the estimated noise floor. Feature decision module 833 compares the noise floor to decision threshold 835, to produce feature decision signal 837. An example decision threshold is the LGF base level shown in FIG. 12A. If feature value signal (estimated noise floor) 832 exceeds decision threshold 835, then feature decision signal 837 is set to a state indicating that the noise floor exceeds the LGF base level. Feature decision signal 837 is denoted as noise_floor_too_high in a logic statement below.

Feature decision signals clipping_too_often 827 and noise_floor_too_high 837 are applied to gain rule 838. The gain logic can be expressed in the MATLAB® language, e.g., as:

```
if clipping_too_often
    gain_direction = -1;
elseif noise_floor_too_high
    gain_direction = -1;
else
    gain_direction = +1;
end
```

Figure 15:
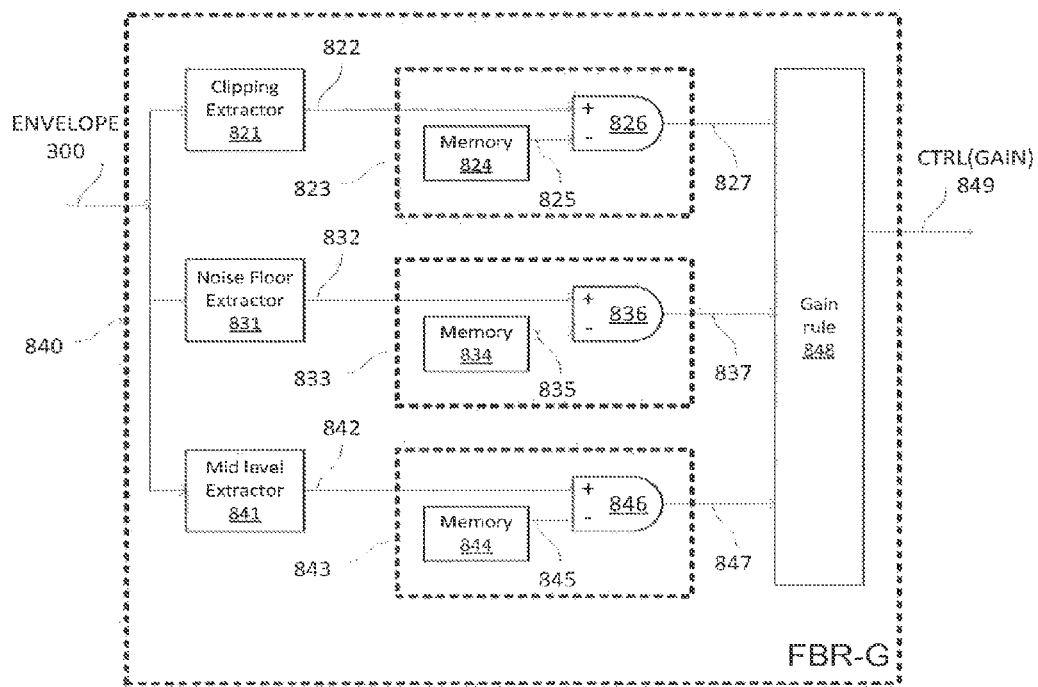

FIG. 15 illustrates another FBR-G 840 according to an embodiment of the present invention. Like FBR-Gs 370, 810 and 820, FBR-G 840 is an example of FBR-Gs 171-174 and 271-274. FBR-G 840 is similar to FBR-G 820, except for the addition of a third feature extractor 841. Feature extractor 841 is denoted a mid-level extractor, and is an instance of feature extractor 620 from FIG. 7, and incorporates normalization as described previously. It is configured with boundary value 520 lying midway between the LGF saturation level and base level shown in FIG. 12A. Thus, BC 541 indicates whether scaled envelope 300 is mapped into the upper section of the dynamic range; in other words, is relatively loud. Thus, feature value signal 842 represents the proportion of scaled envelope samples that were relatively loud during the last time interval. In a logic statement below, feature value signal 842 is denoted as loud_proportion. Feature decision module 843 compares feature value signal loud_proportion 842 to decision threshold 845, to produce feature decision signal 847. An example decision threshold is 0.3. If feature value signal loud_proportion 842 exceeds decision threshold 845, then feature decision signal 827 is set to a state indicating that more than 30% of scaled envelope samples were relatively loud in the last time interval. Feature decision signal 827 is denoted as loud_enough in a logic statement below.

Feature decision signals clipping_too_often 827, noise_floor_too_high 837, and loud_enough 847 are applied to gain rule 848. The gain logic can be expressed in the MATLAB® language, e.g., as:

```
if clipping_too_often
    gain_direction = -1;
elseif noise_floor_too_high
    gain_direction = -1;
elseif not(loud_enough)
    gain_direction = +1;
else
    gain_direction = 0;
end
```

Figure 20:
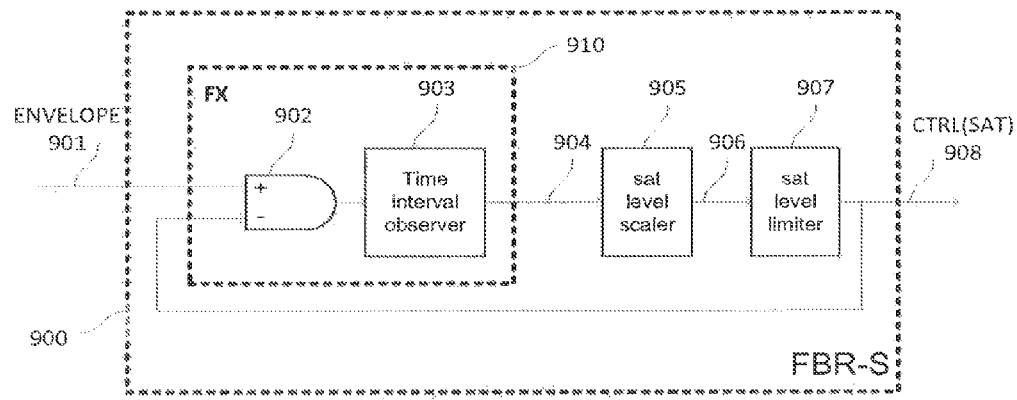
FIG. 20 illustrates a feature-based saturation level regulator, according to an embodiment of the present invention.

FIG. 20 illustrates a saturation-type feature-based regulator (FBR-S) 900 according to an embodiment of the present invention. It is an example of FBR 461 of FIG. 3B, and FBR-Ss 1061 through 1064 in FIG. 1B. The overall operation is that envelope signal 901 is processed by FBR-S 900 to produce saturation-level signal 908. Feature extractor 910 is an example of feature extractor 500 of FIG. 5A. Comparator 902 compares envelope 901 and saturation-level signal 908. If the comparator output is high, it indicates that the envelope is higher than the existing LGF saturation level, i.e., clipping will occur. Time interval observer 903 can utilize e.g., embodiment 601 in FIG. 6, 621 in FIG. 7, or 641 in FIG. 8. Feature value signal 904 represents the proportion of envelope samples that were clipped during the last time interval, and is denoted clipping_proportion. The operation of saturation level scaler 905 can be expressed in the MATLAB® language, e.g., as:

```
if clipping_proportion > 0
    slew_rate = up_slew_rate * clipping_proportion;
else
    slew_rate = down_slew_rate;
end
step_dB = slew_rate / update_rate;
factor = From_dB(step_dB);
sat_level = sat_level * factor;
``` where up_slew_rate is the maximum increase in dB per second and down_slew_rate is the decrease in dB per second, and sat_level is a variable representing the LGF saturation level.

Saturation level limiter 907 constrains the saturation level between a minimum and maximum value. The minimum value of the saturation level in an adaptive LGF system is analogous to the maximum value of gain in an AGC system. It is also beneficial to set a minimum offset between the base level and the saturation level.

Thus, FBR-S 900 employs a feedback loop, where if clipping occurs, then the saturation level is increased, with a slew rate proportional to the proportion of clipping; and if no clipping occurs, then the saturation level is decreased, so that the LGF saturation level tends to follow the peak level of the envelope signal.

Figure 21:
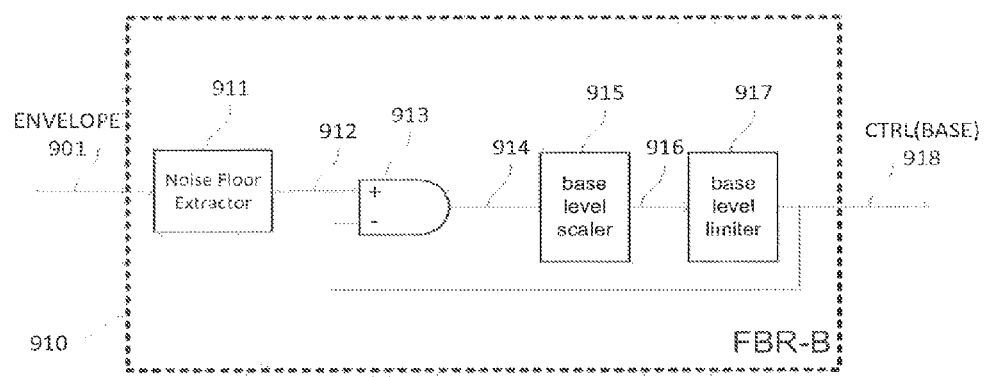
FIG. 21 illustrates a feature-based base level regulator, according to an embodiment of the present invention.

FIG. 21 illustrates a base-level-type feature-based regulator (FBR-B) 900 according to an embodiment of the present invention. It is an example of FBR 462 of FIG. 3C, and FBR-Bs 1041 through 1044 in FIG. 1B. The overall operation is that envelope signal 901 is processed by FBR-B 910 to produce base level signal 918. Noise floor extractor 911 is an example of feature extractor 311 of FIG. 3C, and is similar to noise floor extractor 831 in FIG. 14 and FIG. 15. Feature value signal 912 is the estimated noise floor. Comparator 913 compares the noise floor 912 to base level 918, to produce feature decision signal 914, which is denoted as noise_floor_too_high. The operation of base level scaler 905 can be expressed in the MATLAB® language, e.g., as:

```
if noise_floor_too_high
    base_level = base_level * up_factor
else
    base_level = base_level * down_factor
end
``` where up_factor and down_factor are predetermined values, as described previously. Base level limiter 917 constrains the base level between a minimum and maximum value.

Thus, FBR-B 910 employs a feedback loop, where if the noise floor is higher than the base level, then the base level is increased; and otherwise the base level is decreased, so that the LGF base level tends to follow the noise floor of the envelope signal.

Figure 22:
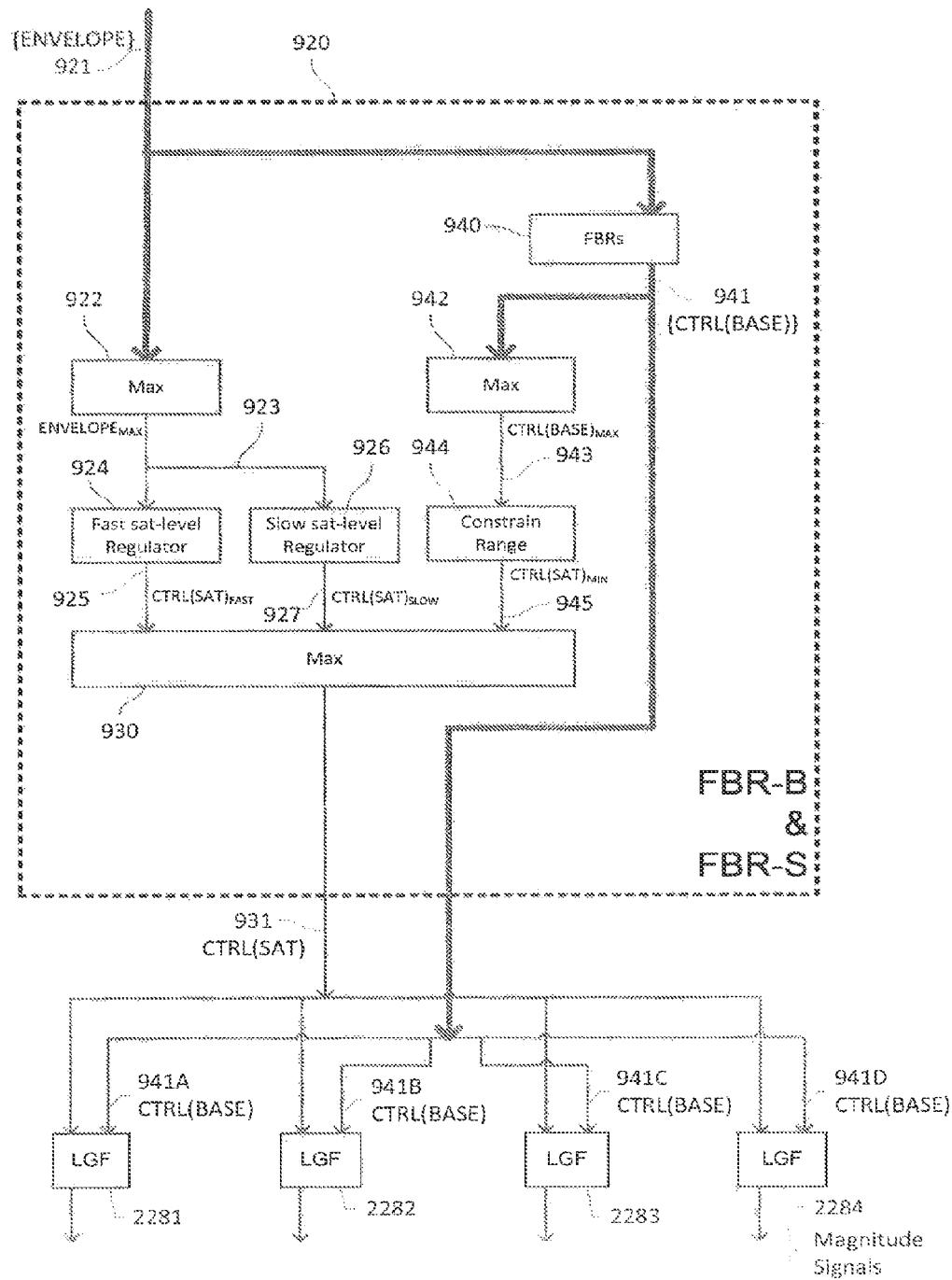
FIG. 22 illustrates a feature-based multiband base level and saturation level regulator, according to an embodiment of the present invention.

FIG. 22 illustrates a feature-based multi-band base level and saturation level regulator (FBR-R & FBR-S) 920 according to an embodiment of the present invention. It is an example of FBR-R & FBR-S 1100 of FIG. 1C. In FIG. 22, thick lines represent a collection of signals, one for each band of the system. The overall operation is that the set of envelope signals 921 is processed by FBR-R & FBR-S 920 to produce a set of base level signals 941 (where a signal set is denoted in FIG. 22 via curly brackets ({ } enclosing the corresponding label) and one saturation level signal 931. In this embodiment, all LGF blocks 2281-2284 have a shared saturation level signal 931. In more detail, a set of envelopes 921 are applied to a set of feature-based base level regulators 940, to produce the set of base level signals 941 that includes member signals 941A-941D that are provided to LGF blocks 2281-2284, respectively. There is, e.g., one feature-based base level regulator, and a corresponding base level signal, for each band. Each feature-based base level regulator can be implemented as described previously, e.g., as in FIG. 21. The set of envelopes 921 are also applied to maxima block 922, which at each instant produces an output signal 923 equal to the largest of its input signals, i.e., output signal 923 is the largest envelope. Largest envelope 923 is applied to a fast saturation level regulator 924, producing a fast saturation level 925. In one embodiment, fast saturation level regulator 924 comprises a peak detector with an instantaneous rise time, and a release time in the range 50 to 750 milliseconds.

Largest envelope 923 is also applied to a slow saturation level regulator 926, producing a slow saturation level 927. In one embodiment, slow saturation level regulator 926 is implemented as in FIG. 20. A purpose of slow saturation level regulator 926 is to improve transitions from one environment to the next, e.g., to compensate for transitions from one talker and another talker or from a quiet room and a noisy street.

The set of base level signals 941 is also applied to maxima block 942, which at each instant produces an output signal 943 equal to the largest of its input signals, i.e., output signal 943 is the largest base level. The largest base level 943 is applied to constrain range block 944, producing minimum saturation level 945. The operation of constrain range block 944 can be expressed in the MATLAB® language, e.g., as:

min_sat_level=largest_base_level+min_range where the quantities are all expressed in decibels, and min_range is for example 20 dB. This has the purpose of ensuring that the saturation level is kept at least a specified number of decibels above the base level, i.e., to ensure that the dynamic range between saturation level and base level exceeds a minimum allowed value.

Fast saturation level 925, slow saturation level 927 and minimum saturation level 945 are applied to maxima block 930, which at each instant produces an output saturation level signal 931 equal to the largest of its input signals.

Figure 16:
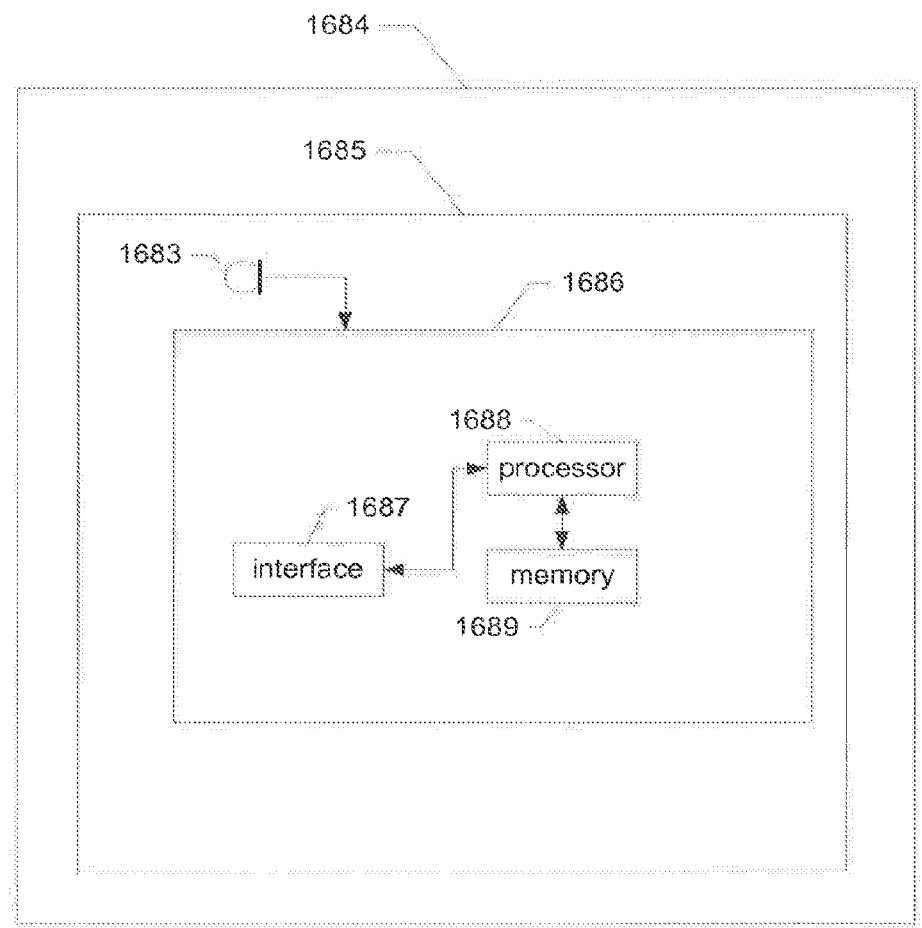
FIG. 16 is a schematic diagram of a sound processor module configured to be incorporated into a multi-band feature-based level control system (which can be implemented in a cochlear implant system) according to an embodiment of the present invention.

FIG. 16 is a schematic diagram of a sound processor module 1686 configured to be incorporated into a multi-band feature-based regulator system (which can be implemented in, for example, a hearing prosthesis 1684, e.g., a cochlear implant system) according to an embodiment of the present invention. Sound processor module 1686 can include any of the feature-based regulator systems (and their various FBR-G, etc.) discussed herein.

In FIG. 16, the cochlear implant system comprises an external component 1685 (e.g., a behind-the-ear (BTE) unit) which is directly or indirectly attached to the body (not shown) of the recipient, and an internal or implantable component (not shown) which is temporarily or permanently implanted in the recipient. External component 1685 typically comprises one or more sound input elements for detecting sound such as a microphone 1683, a sound processor module 1686, a power source (not shown) and an external transmitter unit (not shown). Sound processor module 1686 processes the output of microphone 1683, which is typically positioned by an auricle of the recipient. Sound processor module 1686 generates encoded signals, sometimes referred to as encoded data signals, which are provided to the external transmitter unit via a cable (not shown). Sound processor module 1686 can include a programmable processor 1688, e.g., a digital signal processor (DSP), application-specific integrated circuit (ASIC), etc. Processor 1688 is operatively coupled to a memory 1689, e.g., random access memory (RAM) and/or read-only memory (ROM). Processor 1688 also is operatively coupled via interface 1687, e.g., to the microphone and the external transmitter unit.

Figure 17:
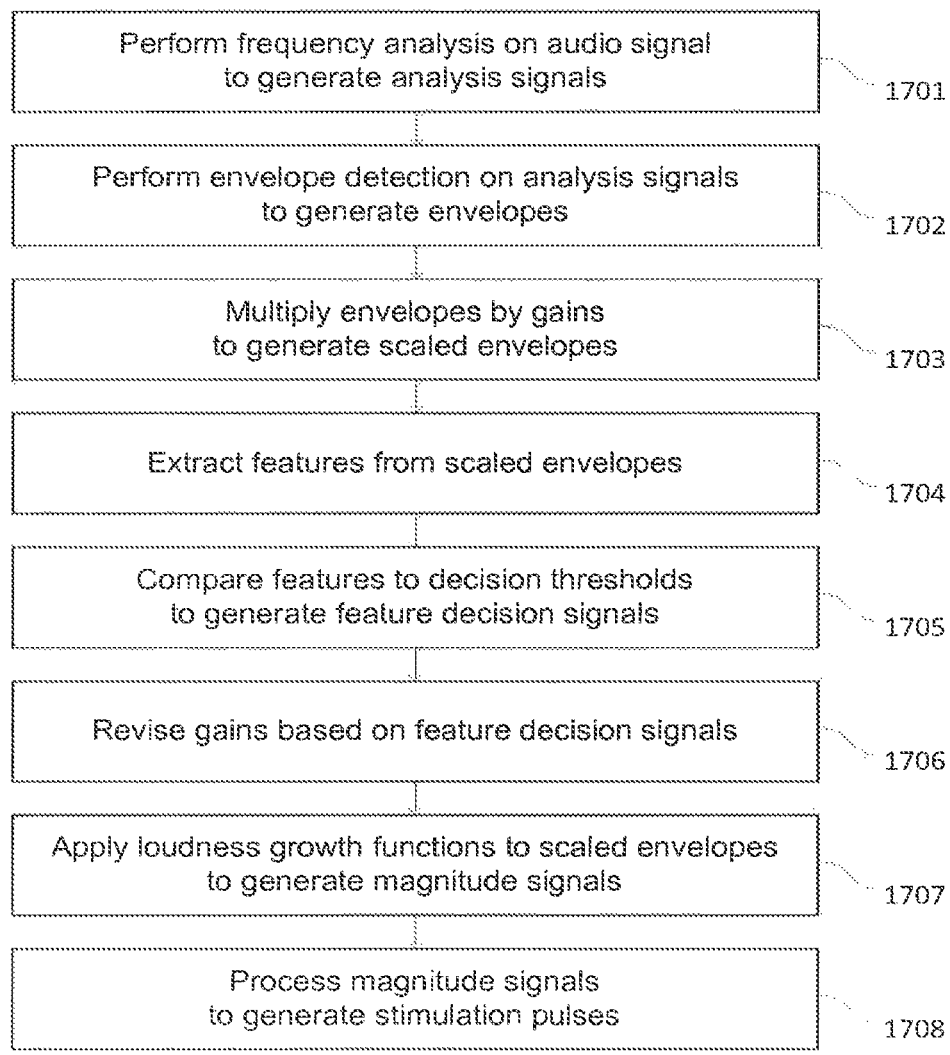
FIGS. 17, 18, and 19 illustrate flow diagrams that describe multi-band processing procedures implemented by, e.g., a sound processor module, according to embodiments of the present invention.

FIG. 17 illustrates a flow diagram that describes a multi-band feature-based gain procedure implemented by, e.g., a sound processor module for a cochlear implant (e.g., 1686), according to an embodiment of the present invention. Starting at block 1701, a frequency analysis (e.g., by a filter bank or by an FFT) is performed upon a digitized audio signal to generate analysis signals. At block 1702, envelope detection is performed on each analysis signal. At block 1703, each of the envelopes is multiplied by a corresponding one of a plurality of gain values, to generate scaled envelopes. At block 1704, one or more features (as discussed herein) are extracted from each scaled envelope. At block 1705, the features are compared to decision thresholds, to generate feature decision signals. At block 1706, the gains are revised (or in other words, refined), based on the feature decision signals. At block 1707, loudness growth functions are applied to the scaled envelopes to generate magnitude signals. At block 1708, the magnitude signals are further processed to produce a set of stimulus pulses.

Figure 18:
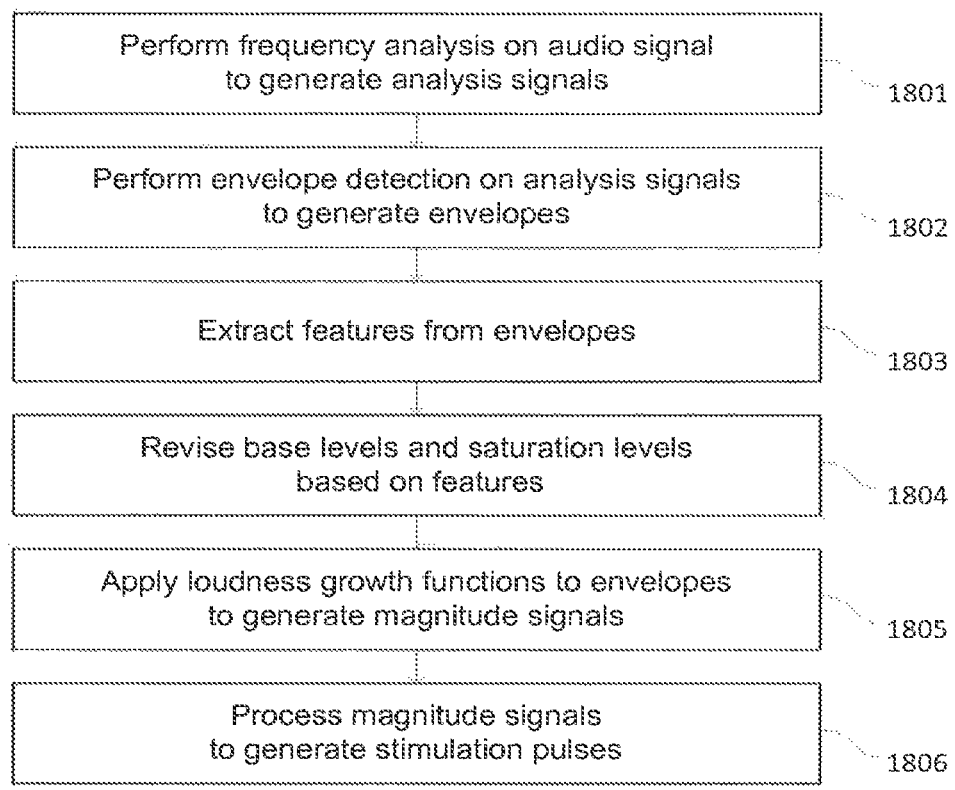

FIG. 18 illustrates a flow diagram that describes a multiband feature-based adaptive LGF procedure implemented by, e.g., a sound processor module for a cochlear implant (e.g., 1686), according to an embodiment of the present invention. Starting at block 1801, a frequency analysis (e.g., by a filter bank or by an FFT) is performed upon a digitized audio signal to generate analysis signals. At block 1802, envelope detection is performed on each analysis signal. At block 1803, one or more features (as discussed herein) are extracted from each envelope. At block 1804, the LGF base levels and saturation levels are revised (or, in other words, refined), based on the extracted features. At block 1805, loudness growth functions, utilizing the revised base levels and saturation levels, are applied to the envelopes to generate magnitude signals. At block 1806, the magnitude signals are further processed to produce a set of stimulus pulses.

Figure 19:
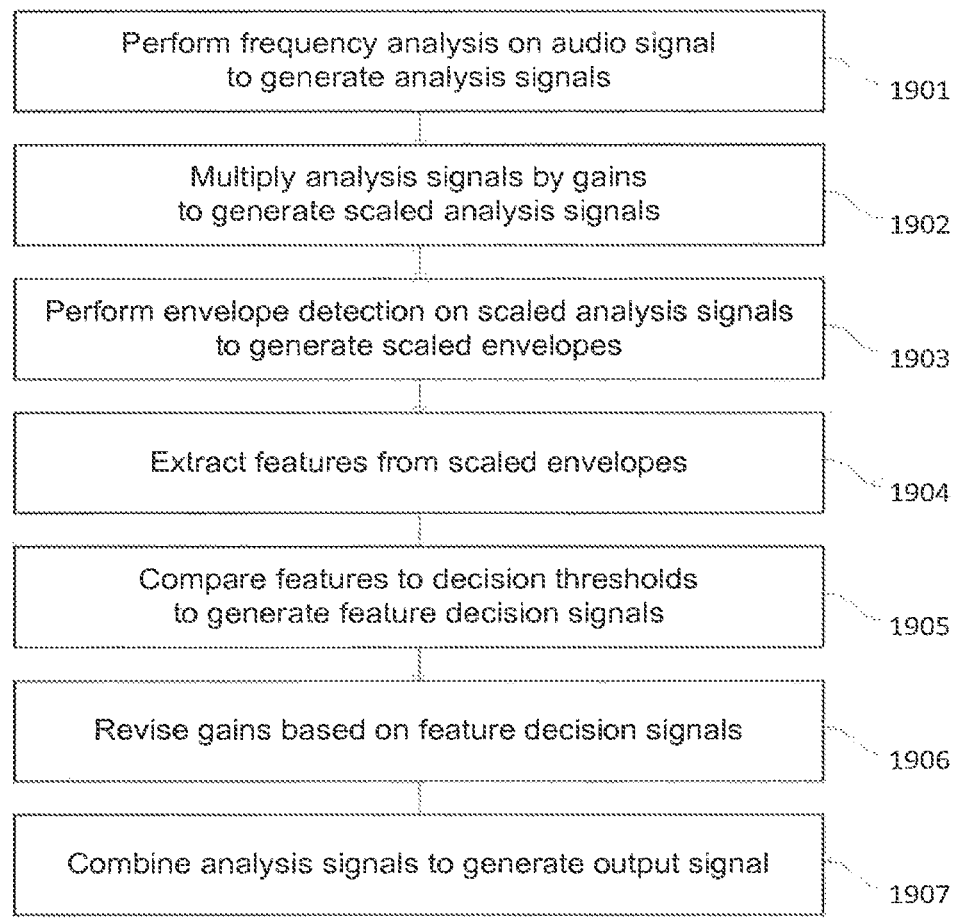

FIG. 19 illustrates a flow diagram that describes a multiband feature-based gain procedure implemented by, e.g., a sound processor module for an application that provides an audio signal output, according to an embodiment of the present invention. Starting at block 1901, a frequency analysis (e.g., by a filter bank or by an FFT) is performed upon a digitized audio signal to generate analysis signals. At block 1902, each analysis signal is multiplied by a corresponding one of a plurality of gain values, to generate scaled analysis signals. At block 1903, envelope detection is performed on each scaled analysis signal. At block 1904, one or more features (as discussed herein) are extracted from each scaled envelope. At block 1905, the features are compared to decision thresholds, to generate feature decision signals. At block 1906, the gains are revised (or, in other words, refined), based on the feature decision signals. At block 1907, the analysis signals are combined (e.g., by summation or by an inverse FFT) to produce an output signal.

Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

Reference herein to "one embodiment" or "an embodiment" means that a particular feature, structure, operation, or other characteristic described in connection with the embodiment may be included in at least one implementation of the present invention. However, the appearance of the phrase "in one embodiment" or "in an embodiment" in various places in the specification does not necessarily refer to the same embodiment. It is further envisioned that a skilled person could use any or all of the above embodiments in any compatible combination or permutation.

While various embodiments of the present invention have been described above, it should be understood that they have been presented by way of example only, and not limitation. It will be apparent to persons skilled in the relevant art that various changes in form and detail may be made therein without departing from the scope of the present invention. Thus, the breadth and scope of the present invention should not be limited by any of the above-described exemplary embodiments, but should be defined only in accordance with the following claims and their equivalents.

What is claimed is:

1. A sound processing device, comprising:
one or more feature extractors configured to extract one or more features from a sound signal envelope;
a controller configured to generate one or more control signals based on the one or more features; and
a compressor configured to perform adaptive signal compression by applying a loudness growth function (LGF) to the envelope according to the one or more control signals to modify a level of the envelope and produce a compressed signal.

2. The sound processing device of claim 1, wherein the compressed signal is a magnitude signal.

3. The sound processing device of claim 1, wherein at least one of the one or more control signals generated by the controller indicates a base level of the loudness growth function when performing the adaptive signal compression, and wherein the compressor is configured to adapt the loudness growth function according to the base level signal.

4. The sound processing device of claim 1, wherein at least one of the one or more control signals generated by the controller indicates a saturation level of the loudness growth function when performing the adaptive signal compression, and wherein the compressor is further configured to adapt the loudness growth function according to the saturation-level signal.

5. The sound processing device of claim 1, wherein the controller is configured to generate a gain, and wherein the sound processing device further comprises:
an amplifier configured to adaptively amplify the envelope according to the gain.

6. The sound processing device of claim 1, wherein the sound processing device is a hearing prosthesis that comprises
a microphone;
one or more memories; and
a processor operatively coupled to the microphone and the one or more memories, wherein the processor is configured to execute instructions stored in the one or more memories to implement the one or more feature extractors, the controller, and the compressor.

7. The sound processing device of claim 6, wherein the envelope is derived from an input sound signal obtained from the microphone.

8. The sound processing device of claim 6, wherein the processor is configured to adapt stimulation signals according to the one or more control signals, and wherein the hearing prosthesis further includes:
stimulating circuitry configured to stimulate tissue of a recipient of the hearing prosthesis according to the stimulation signals.

9. The sound processing device of claim 8, wherein the hearing prosthesis is a cochlear implant.

10. A sound processing device comprising:
a set of feature-based regulators configured to produce a set of control signals from a set of envelopes, respectively; and
a plurality of compressors configured to perform signal compression by adaptively applying loudness growth functions (LGFs) to the set of envelopes according to the set of control signals;
wherein the set of control signals includes:
a compressor-common control signal applicable to all of the compressors; and a plurality of compressor-specific control signals, where each of the plurality of compressor-specific control signals is applicable to only one of the plurality of compressors.

11. The sound processing device of claim 10, wherein:
the set of control signals includes a subset of saturation signals; and
the device further comprises:
selection logic configured to select the compressor-common control signal from amongst the subset of saturation signals.

12. The sound processing device of claim 11, wherein:
the set of feature-based regulators includes a subset of saturation-level regulators (FBR-Ss) configured to generate the subset of saturation signals from corresponding members of the set of envelopes, respectively.

13. The sound processing device of claim 12, wherein the set of FBR-Ss includes one or more of:
a fast FBR-S configured to generate a fast saturation signal;
a slow FBR-S configured to generate a slow saturation signal; and
a minimizing FBR-S configured to generate a minimum saturation level that is at least a desired amount greater than a corresponding base level.

14. The sound processing device of claim 13, further comprising:
a maxima selector configured to select the maximum-valued member from the set of envelopes;
wherein each of the fast FBR-S and the slow FBR-S is further configured to operate on the maximum-valued member amongst the set of envelopes.

15. The sound processing device of claim 13, wherein:
the minimizing FBR-S is further configured to operate on a maximum-valued member of a set of base level signals.

16. The sound processing device of claim 10, wherein:
the set of feature-based regulators includes a subset of base-level regulators (FBR-Bs) configured to generate a set of base signals from corresponding members of the set of subject signals, respectively; and
the set of base signals is the set of compressor-specific control signals.

17. The sound processing device of claim 10, wherein the sound processing device is a hearing prosthesis that comprises:
a microphone;
one or more memories; and
a processor, operatively coupled to the microphone and the one or more memories, wherein the processor is configured to execute instructions stored in the one or more memories to implement the one or more feature-based regulators and the compressors.

18. The sound processing device of claim 17, wherein the processor is further configured to adapt stimulation signals according to the one or more control signals, and wherein the hearing prosthesis further includes:
stimulating circuitry to stimulate tissue of a recipient of the hearing prosthesis according to the stimulation signals.

19. The sound processing device of claim 17, wherein the envelope is derived from an input sound signal obtained at least indirectly from the microphone.

20. The sound processing device of claim 10, wherein one or more of the compressors is a non-linear compressor.

* * * * *